(12) United States Patent
Miyakawa et al.

(10) Patent No.: US 10,783,946 B2
(45) Date of Patent: Sep. 22, 2020

(54) SEMICONDUCTOR MEMORY DEVICE INCLUDING MEMORY CELL ARRAYS

(71) Applicant: TOSHIBA MEMORY CORPORATION, Minato-ku, Tokyo (JP)

(72) Inventors: Tadashi Miyakawa, Yokohama Kanagawa (JP); Katsuhiko Hoya, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/352,483

(22) Filed: Mar. 13, 2019

(65) Prior Publication Data
US 2020/0168263 A1     May 28, 2020

(30) Foreign Application Priority Data
Nov. 26, 2018   (JP) .................. 2018-220588

(51) Int. Cl.
*G11C 11/16*     (2006.01)

(52) U.S. Cl.
CPC ........ *G11C 11/1657* (2013.01); *G11C 11/161* (2013.01); *G11C 11/1655* (2013.01); *G11C 11/1697* (2013.01)

(58) Field of Classification Search
CPC ............ G11C 13/0028; G11C 11/5678; G11C 13/0026
See application file for complete search history.

(56) References Cited

U.S. PATENT DOCUMENTS

| | | | |
|---|---|---|---|
| 8,094,477 B2* | 1/2012 | Maejima | G11C 8/08 365/148 |
| 8,139,415 B2* | 3/2012 | Kim | G11C 8/10 365/185.05 |
| 2004/0125650 A1* | 7/2004 | Tsuji | G11C 11/16 365/173 |
| 2012/0069627 A1* | 3/2012 | Minemura | G11C 13/0004 365/148 |
| 2014/0022848 A1 | 1/2014 | Samachisa et al. | |
| 2014/0050021 A1* | 2/2014 | Kim | G11C 7/00 365/163 |
| 2014/0149827 A1 | 5/2014 | Kim et al. | |
| 2014/0219004 A1 | 8/2014 | Minemura et al. | |
| 2014/0353573 A1 | 12/2014 | Kalra et al. | |
| 2015/0124518 A1* | 5/2015 | Nagashima | G11C 13/0004 365/148 |
| 2015/0262622 A1* | 9/2015 | Iizuka | G11C 13/004 365/63 |

(Continued)

*Primary Examiner* — Mushfique Siddique
(74) *Attorney, Agent, or Firm* — Holtz, Holtz & Volek PC

(57) ABSTRACT

According to an embodiment, a semiconductor memory device includes: memory cell arrays; word lines respectively connected to rows of each of the memory cell arrays; bit lines respectively connected to columns of each of the memory cell arrays; row selection circuits provided so as to respectively correspond to the memory cell arrays and connected to the word lines; and column selection circuits provided so as to respectively correspond to the memory cell arrays and connected to the bit lines. When an identical row address is received, the row selection circuits perform selection operations of word lines so that word line lengths from selected memory cells to the row selection circuits vary.

19 Claims, 38 Drawing Sheets

(56) References Cited

U.S. PATENT DOCUMENTS

| | | | |
|---|---|---|---|
| 2015/0325289 A1* | 11/2015 | Castro | G11C 13/0002 |
| | | | 365/148 |
| 2018/0040371 A1 | 2/2018 | Kim | |
| 2018/0144798 A1* | 5/2018 | Yoon | G11C 8/10 |
| 2019/0287594 A1* | 9/2019 | Osada | H01L 43/08 |

* cited by examiner

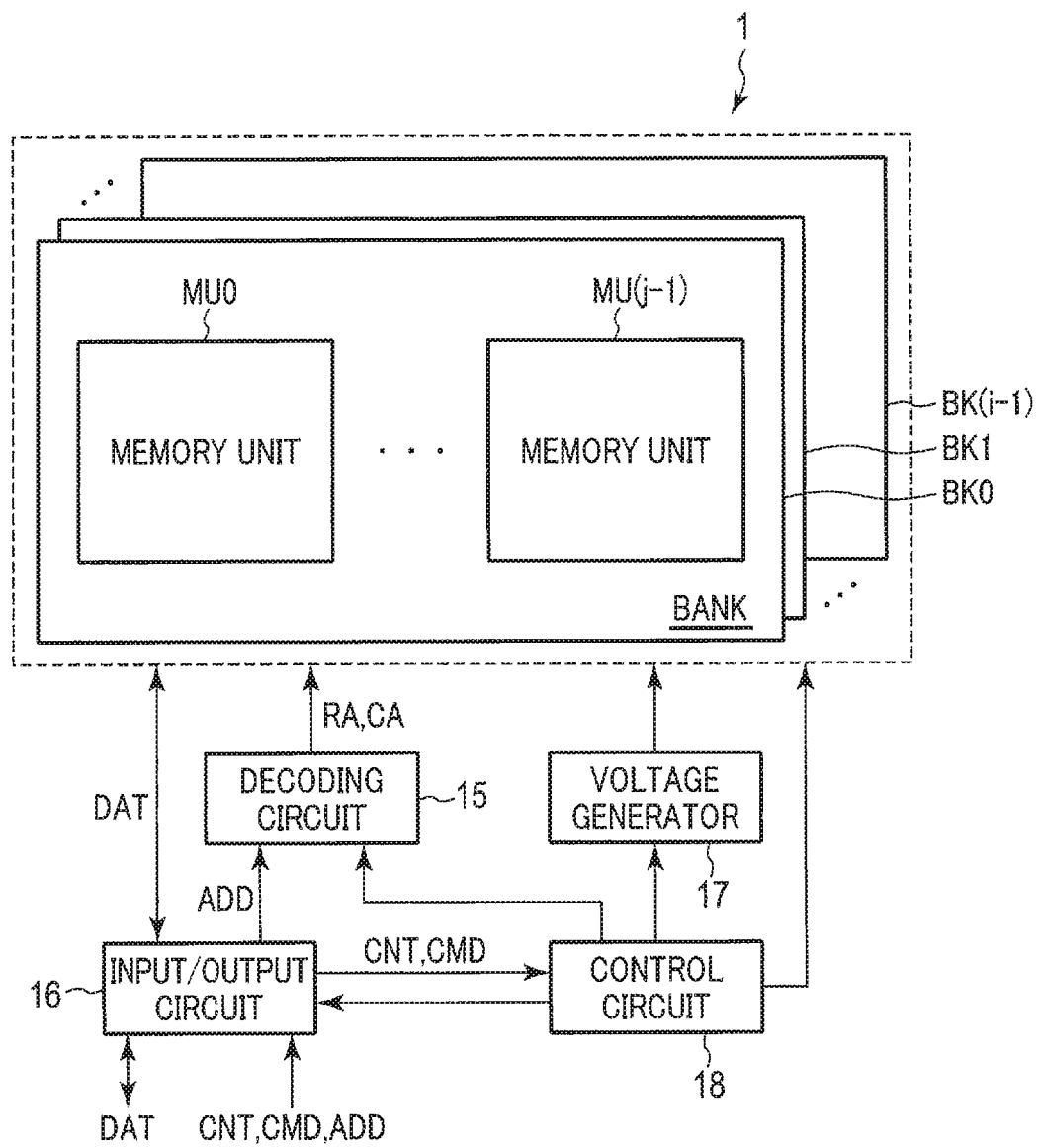
F I G. 1

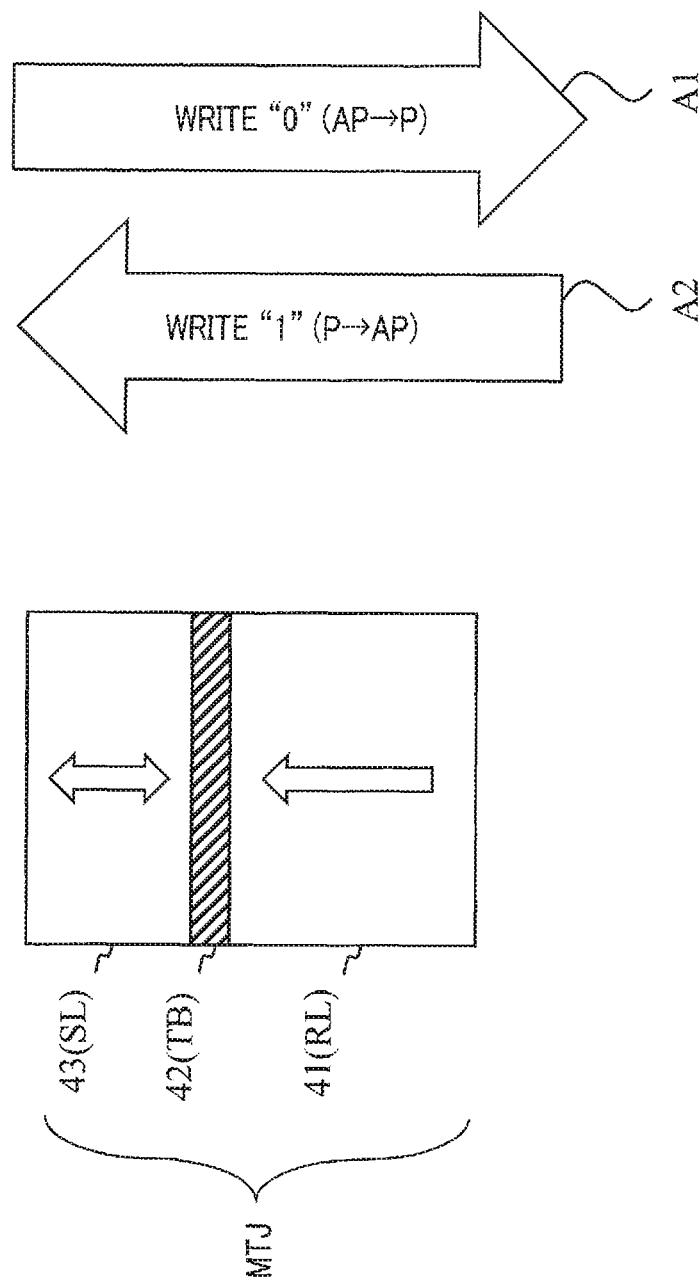
F I G. 6

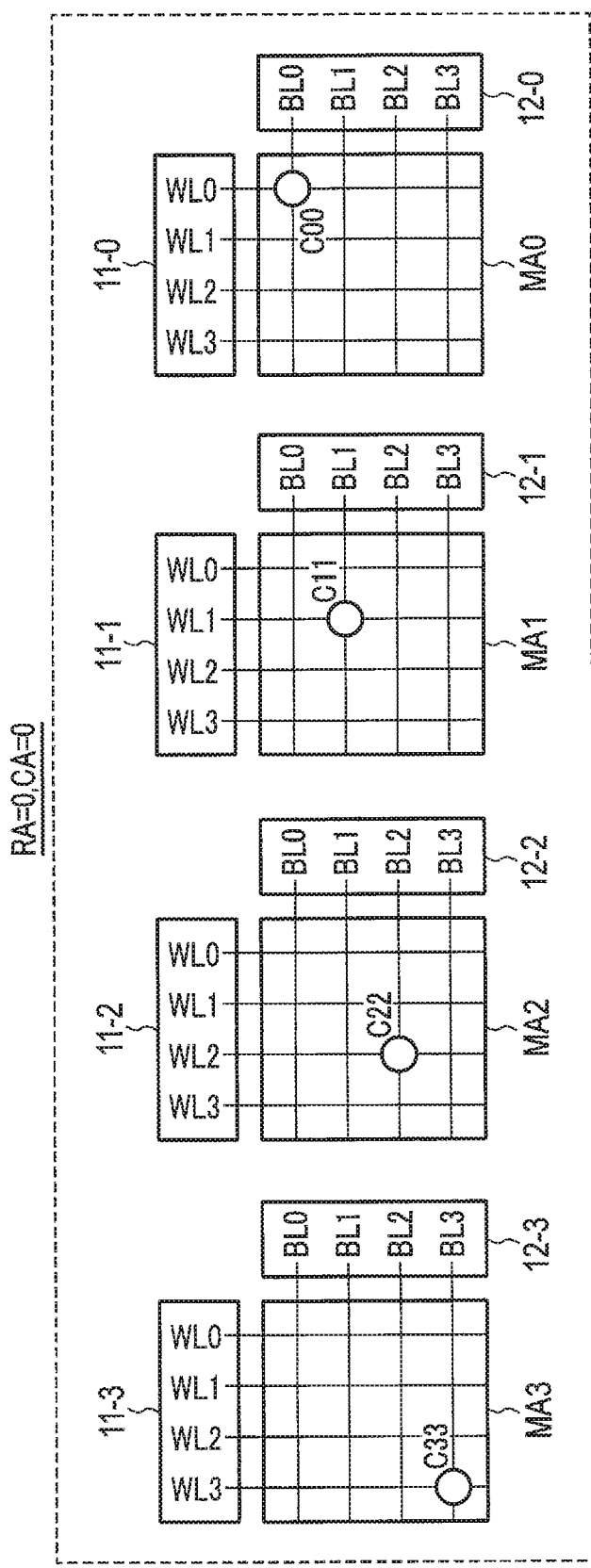
F I G. 10A

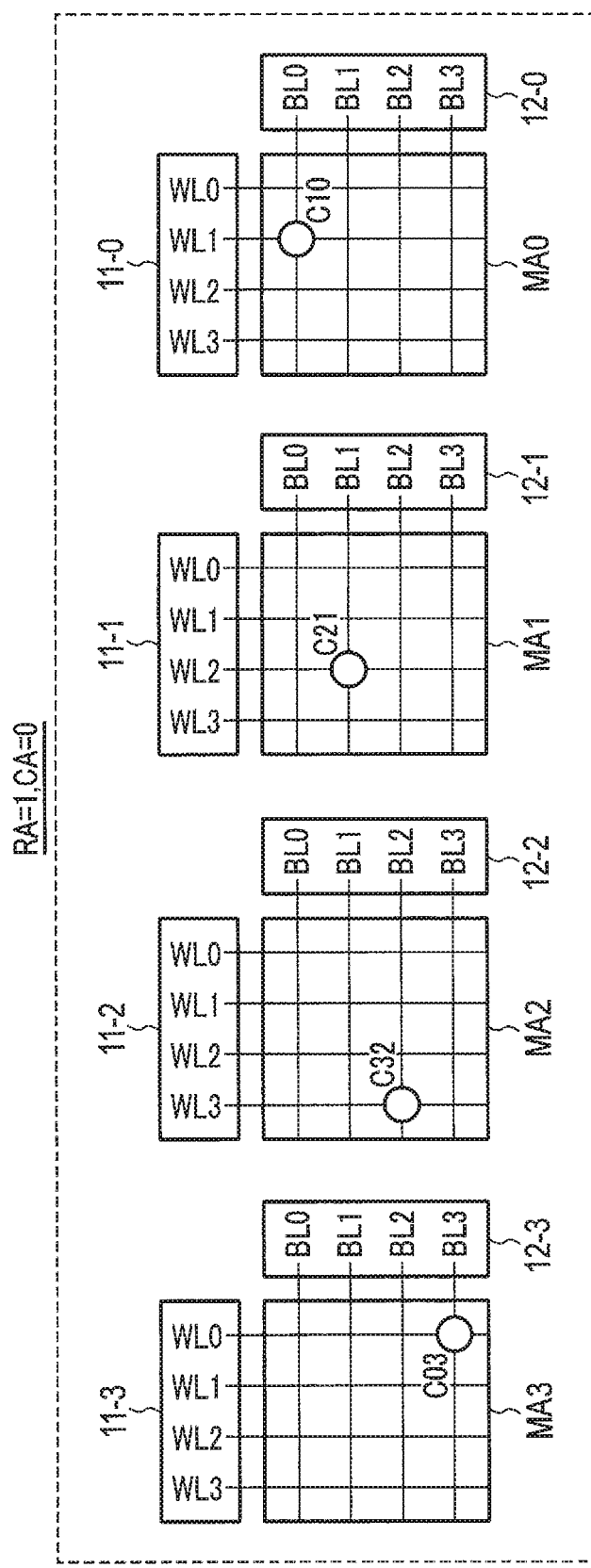
F I G. 11A

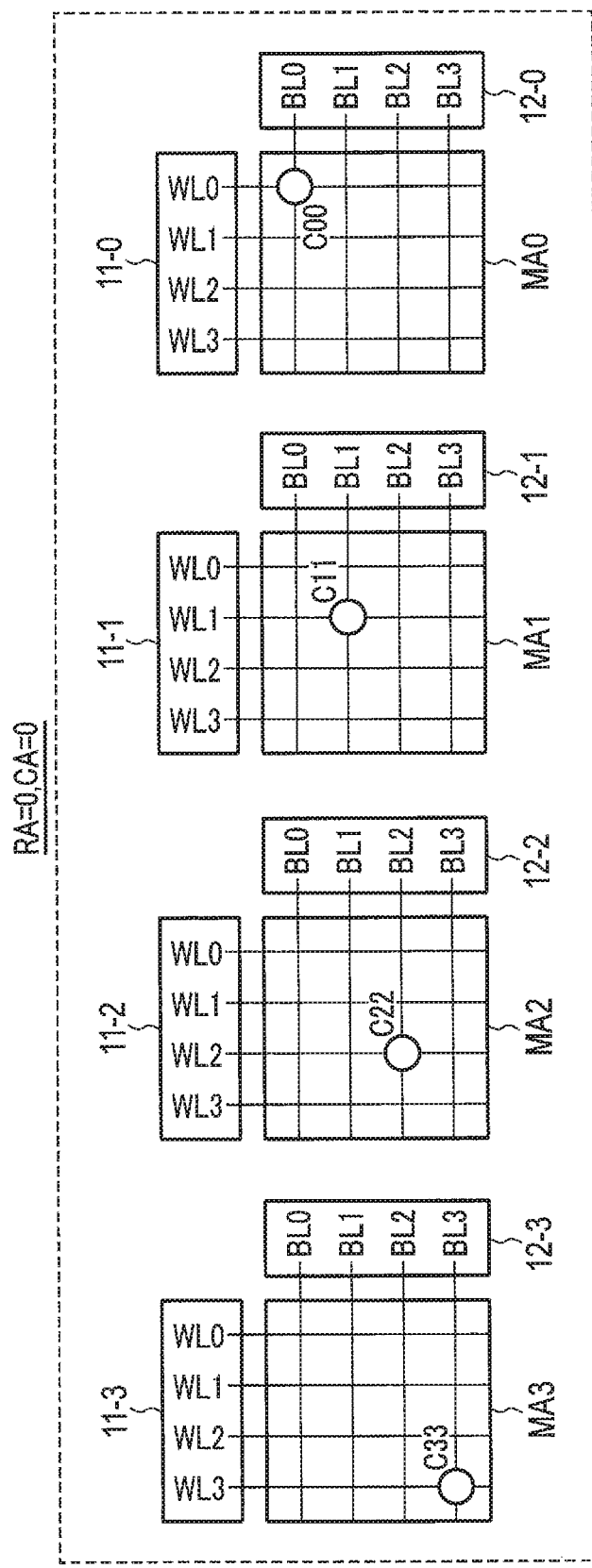
F I G. 12A

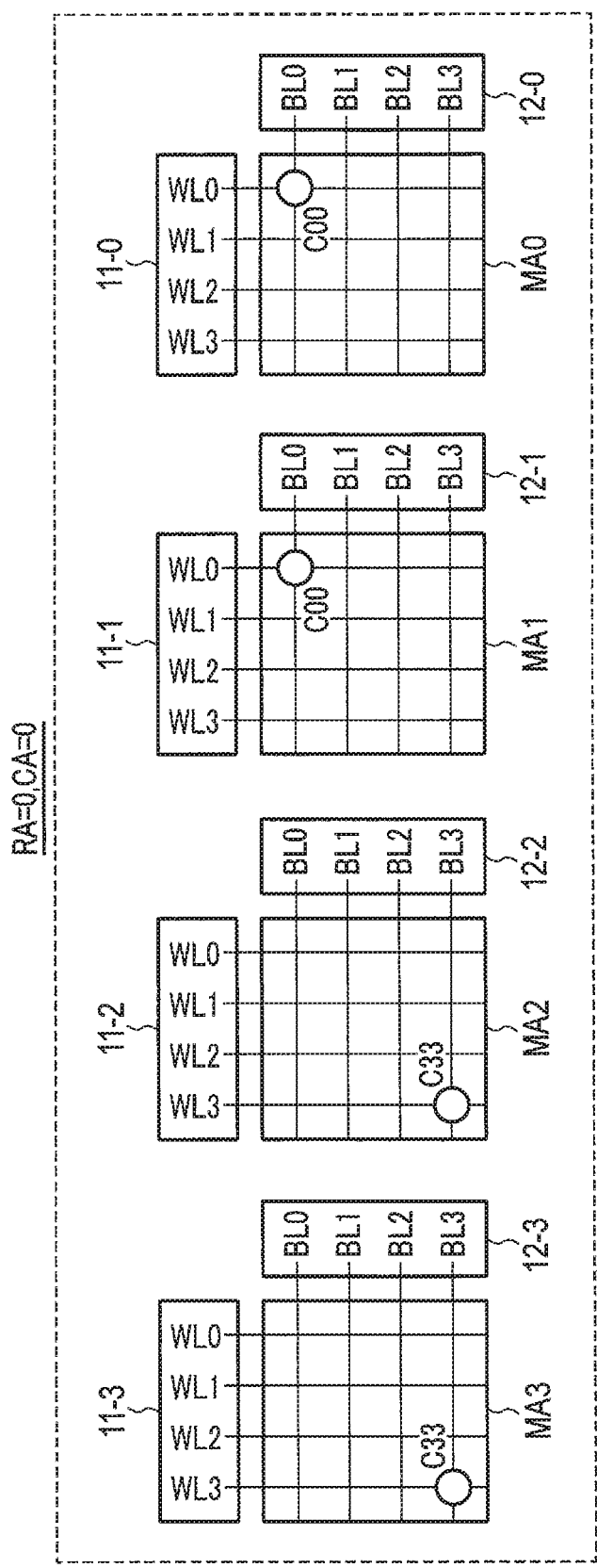
F I G. 14A

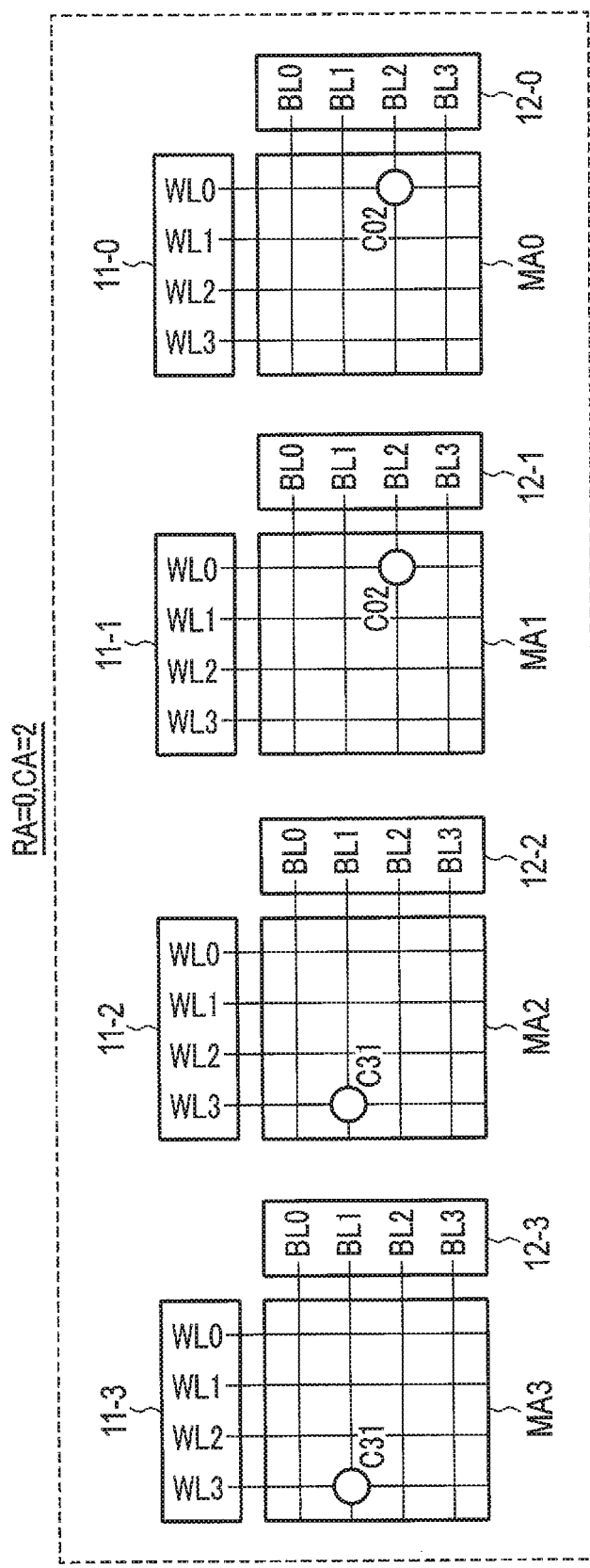
F I G. 14C

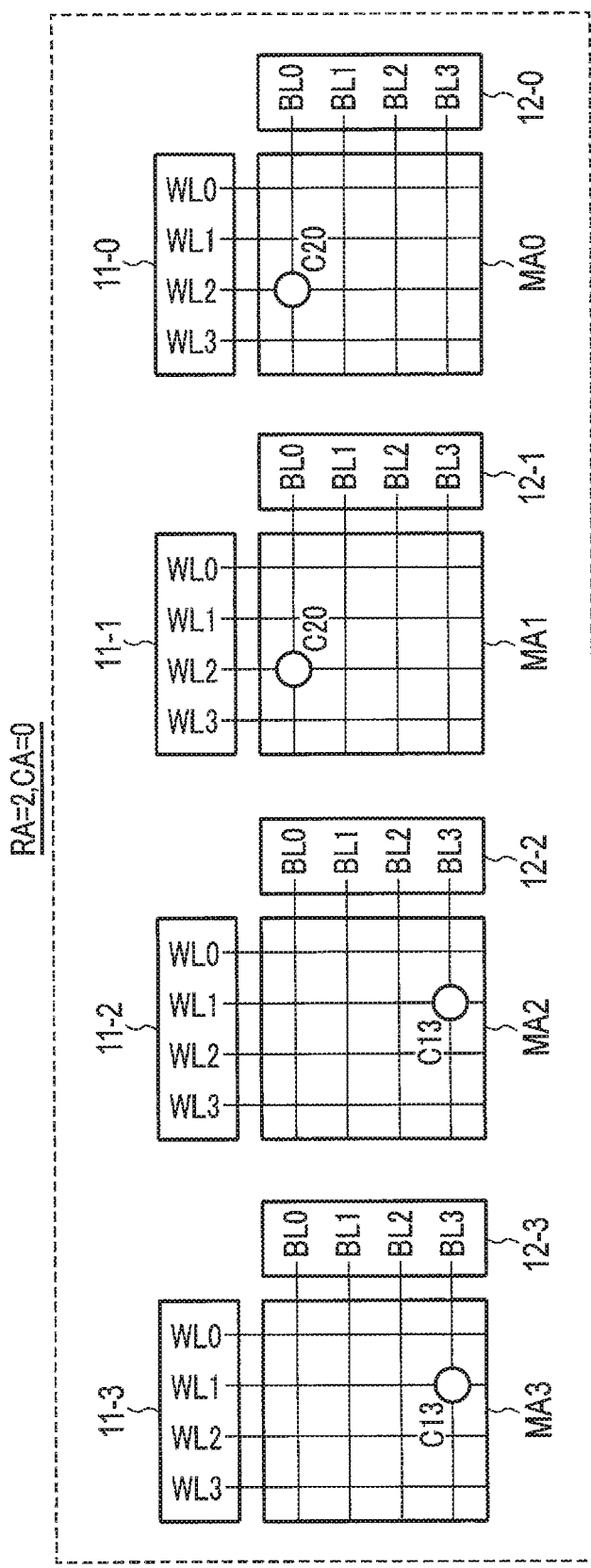
F I G. 15A

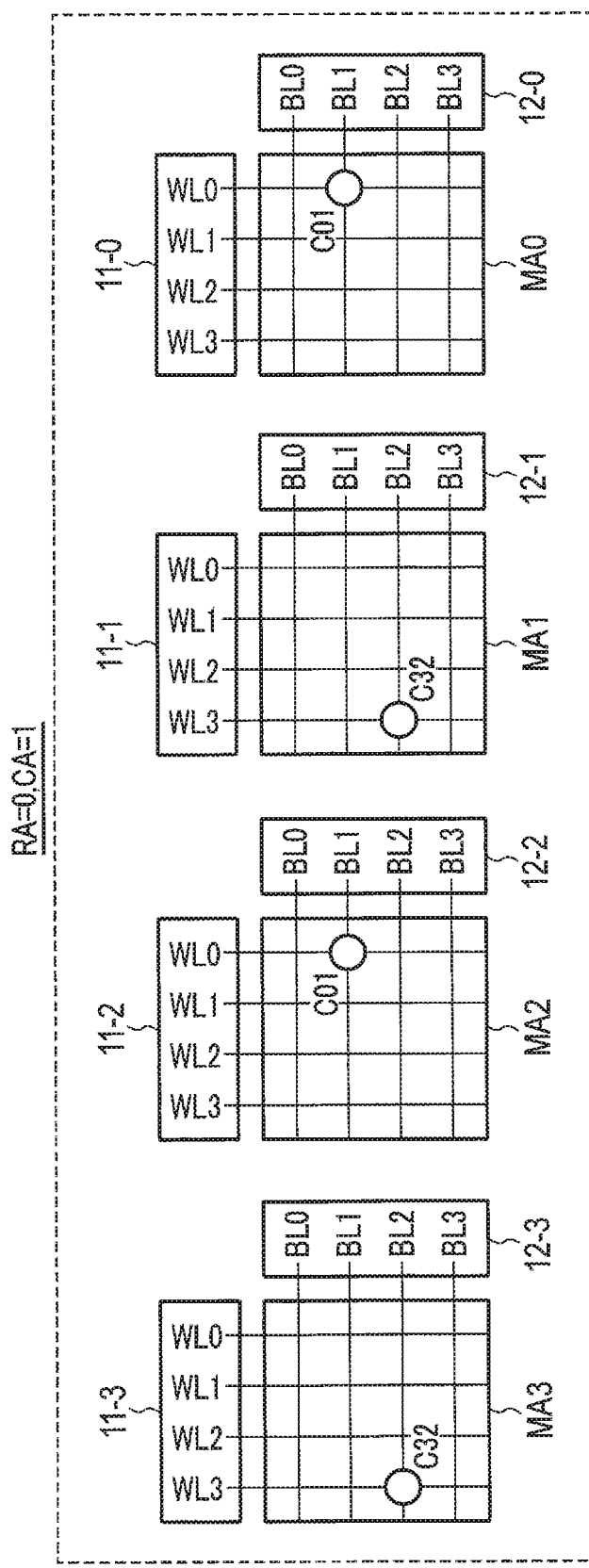
F I G. 17B

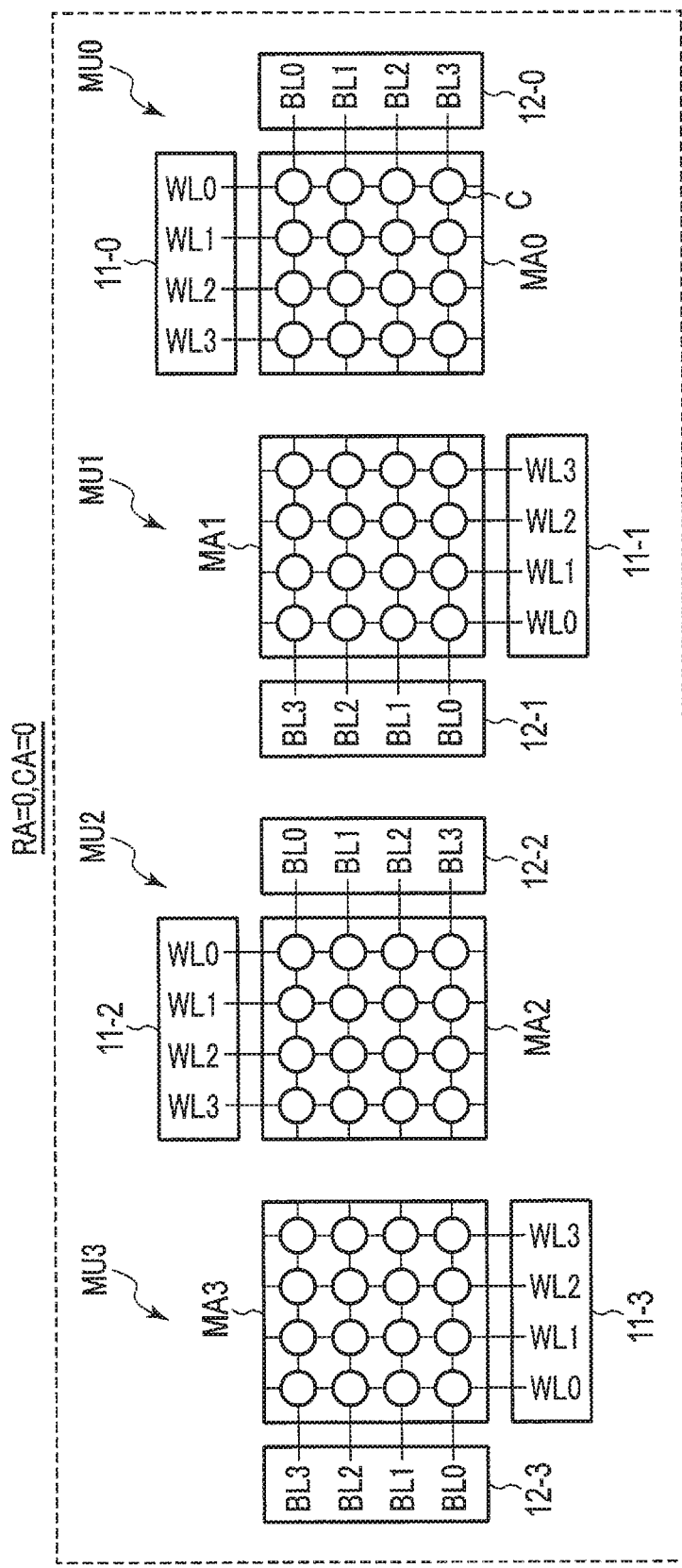
F I G. 18

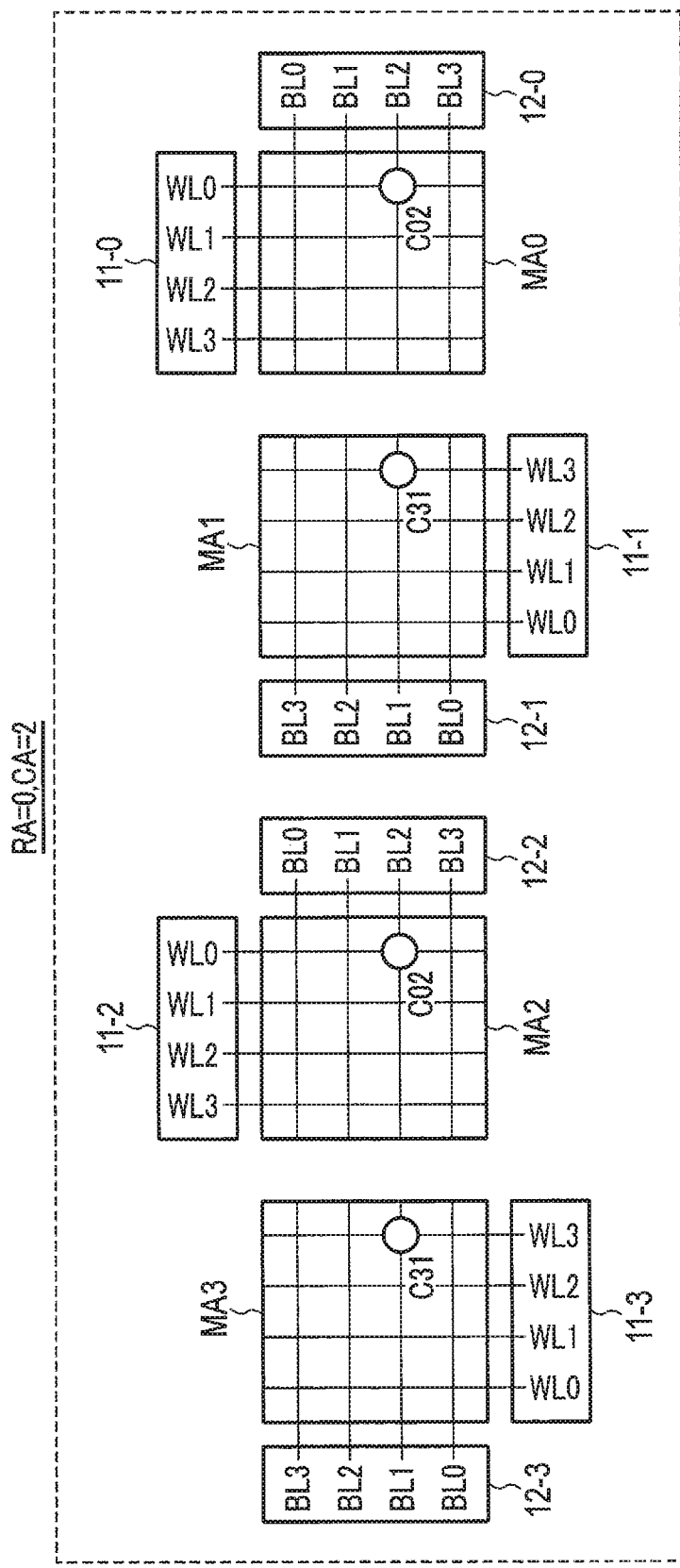
F I G. 19C

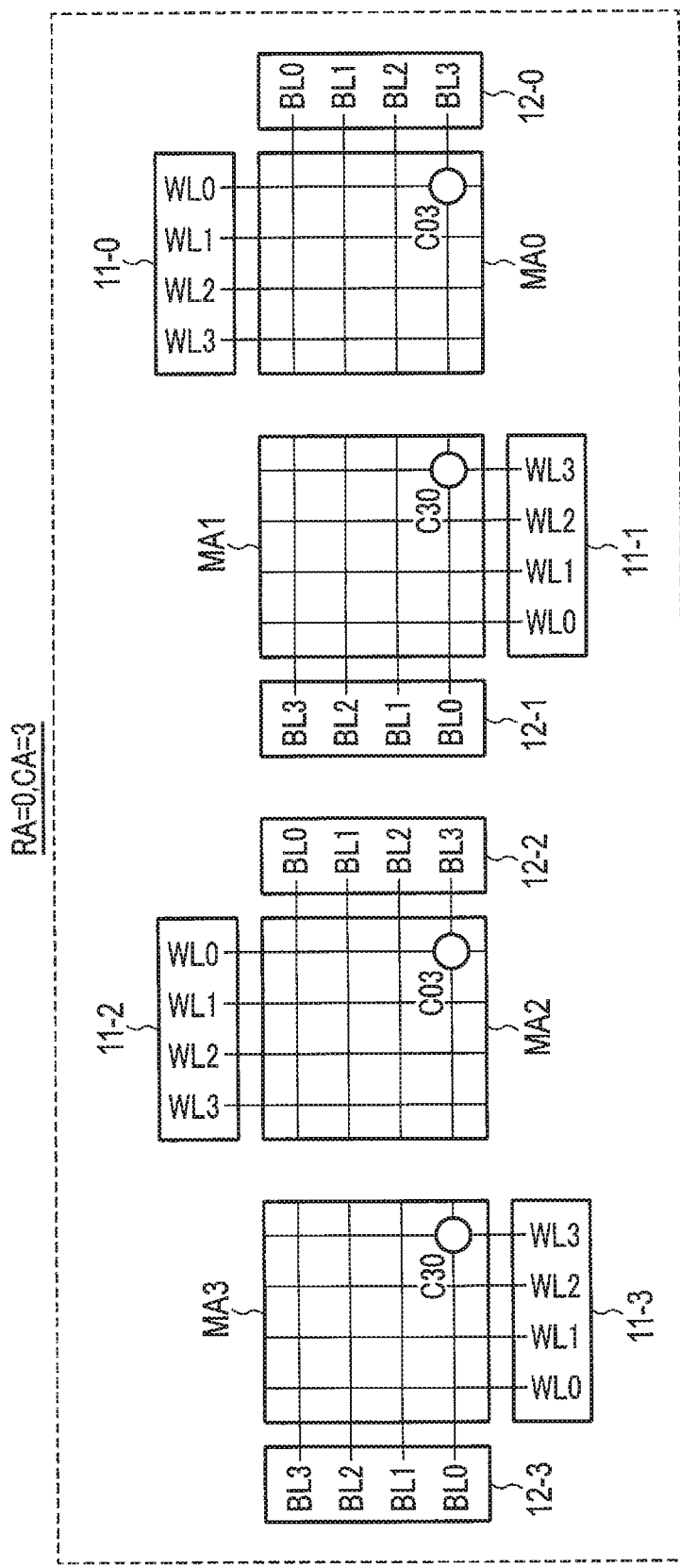
F I G. 19D

US 10,783,946 B2

SEMICONDUCTOR MEMORY DEVICE INCLUDING MEMORY CELL ARRAYS

CROSS-REFERENCE TO RELATED APPLICATIONS

This application is based upon and claims the benefit of priority from Japanese Patent Application No. 2018-220588, filed Nov. 26, 2018, the entire Contents of which are incorporated herein by reference.

FIELD

Embodiments described herein relate generally to a semiconductor memory device.

BACKGROUND

Resistance change memories are known as a type of semiconductor memory device. Magnetoresistive random access memories (MRAM) are known as a type of resistance change memory. MRAMs are memory devices using magnetoresistive elements having a magnetoresistive effect as memory cells storing information.

BRIEF DESCRIPTION OF THE DRAWINGS

FIG. 1 is a block diagram of a semiconductor memory device according to a first embodiment;

FIG. 6 is a cross-sectional diagram of a magnetoresistive effect element;

FIG. 10A is a diagram illustrating a select operation of a memory unit according to Example 1-1;

FIG. 11A is a diagram illustrating a select operation of a memory unit according to Example 1-2;

FIG. 12A is a diagram illustrating a select operation of a memory unit according to Example 1-3;

FIG. 14A is a diagram illustrating a select operation of a memory unit according to Example 2-1;

FIG. 14C is a diagram illustrating a select operation of the memory unit according to Example 2-1;

FIG. 15A is a diagram illustrating a select operation of a memory unit according to Example 2-2;

FIG. 17B is a diagram illustrating a memory unit according to the third embodiment;

FIG. 18 is a block diagram of a plurality of memory units according to a fourth embodiment;

FIG. 19C is a diagram illustrating a select operation of a memory unit according to the fourth embodiment; and FIG. 19D is a diagram illustrating a select operation of a memory unit according to the fourth embodiment.

DETAILED DESCRIPTION

Figure 2:
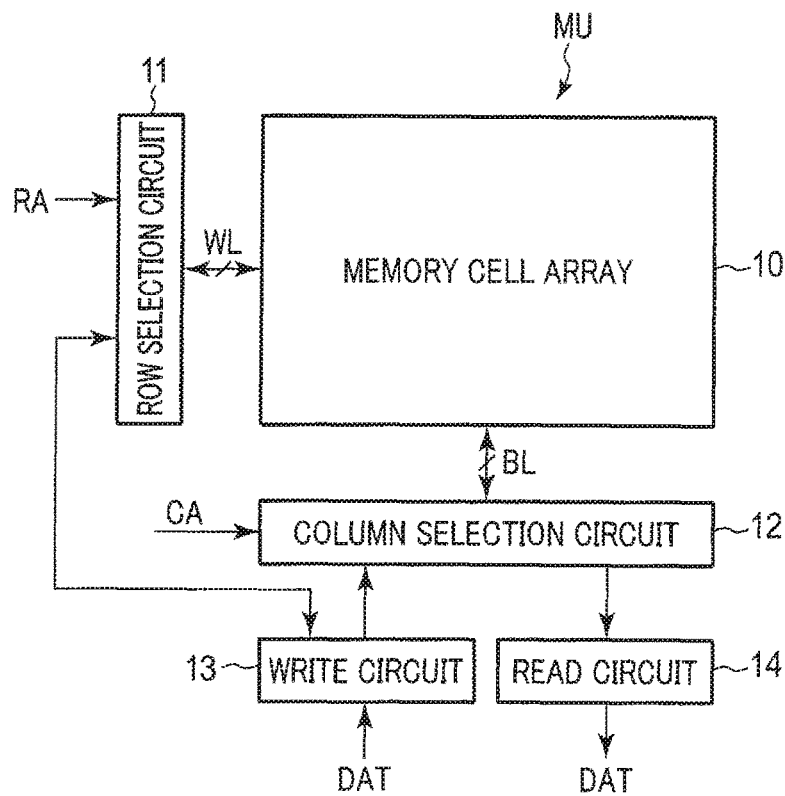
FIG. 2 is a block diagram of a memory unit shown in FIG. 1.

In general, according to one embodiment, there is provided a semiconductor memory device comprising:

a plurality of memory cell arrays each comprising a plurality of memory cells arranged in a matrix form;

a plurality of word lines respectively connected to plurality of rows of each of the memory cell arrays;

a plurality of bit lines respectively connected to a plurality of columns of each of the memory cell arrays;

a plurality of rows election circuits provided so as to respectively correspond to the memory cell arrays and connected to the word lines; and a plurality of column selection circuits provided so as to respectively correspond to the memory cell arrays and connected to the bit lines, wherein when an identical row address is received, the row selection circuits perform selection operations of word lines so that word line lengths from selected memory cells to the row selection circuits vary, and when an identical column address is received, the column selection circuits perform selection operations of bit lines so that bit line lengths from the selected memory cells to the column selection circuits vary.

Hereinafter, embodiments will be explained with reference to the drawings. Some of the embodiments shown below exemplify a device and a method to embody the technical idea of the present invention, and do not specify the technical idea of the present invention by the configuration, structure, arrangement of components to those described below. Each functional block can be achieved as either of hardware or software, or a combination of hardware and software. It is not essential that respective functional blocks are differentiated as shown in the following examples. For example, a part of a function may be implemented by another functional block different from an exemplified functional block.

Furthermore, the exemplified functional block may be further divided into small functional sub-blocks. In the following explanation, constituent elements having the same function and structure are denoted by the same reference numerals, and overlapping explanation thereof is provided only when necessary.

[1] First Embodiment

In the following embodiments, as a semiconductor memory device, a magnetoresistive random access memory (MRAM) which is a kind of resistance change memory will be explained by way of example.

[1-1] Configuration of Semiconductor Memory Device

FIG. 1 is a block diagram of a semiconductor memory device 1 according to a first embodiment. The semiconductor memory device 1 includes a plurality (i pieces) of banks (memory banks) BK0 to BK(i−1), a decoding circuit 15, an input/output circuit 16, a voltage generator 17, and a control circuit 18.

Each of the plurality of banks BK0 to BK(i−1) includes a plurality of memory units MU0 to MU(j−1). Each of the plurality of memory units MU0 to MU(j−1) includes a memory cell array, etc. The plurality of banks BK have the same configuration. The configuration of the memory unit MU will be described later.

The decoding circuit 15 receives an address ADD from the input/output circuit 16. The decoding circuit 15 decodes an address ADD to generate a bank address, a row address RA, and a column address CA. The decoding circuit 15 selects a corresponding bank using a bank address. The decoding circuit 15 supplies a row address RA and a column address CA to a selected bank.

The input/output circuit 16 receives an address ADD, command CMD, a plurality of types of control signal CNT, and data DAT from the outside of the semiconductor memory device 1. The input/output circuit 16 sends the address ADD to the decoding circuit 15, sends a command CMD and a control signal CNT to the control circuit 18, and sends the data DAT to the bank BK. Also, the input/output circuit 16 outputs the data. DAT sent from the bank BK to the outside.

The voltage generator 17 generates a plurality of types of voltages necessary for an operation of the bank BK using a power supply voltage supplied from the outside of the semiconductor memory device 1. The voltage generator 17 generates a plurality of types of voltages necessary, for example, for a write operation and supplies the voltages to a write circuit included in a bank BK. Also, the voltage generator 17 generates a plurality of types of voltages necessary for, for example, a read operation and supplies the voltages to a read circuit included in a bank BK.

The control circuit 18 controls various modules included in the semiconductor memory device 1, based on the control signal CNT and the command CMD.

Figure 3:
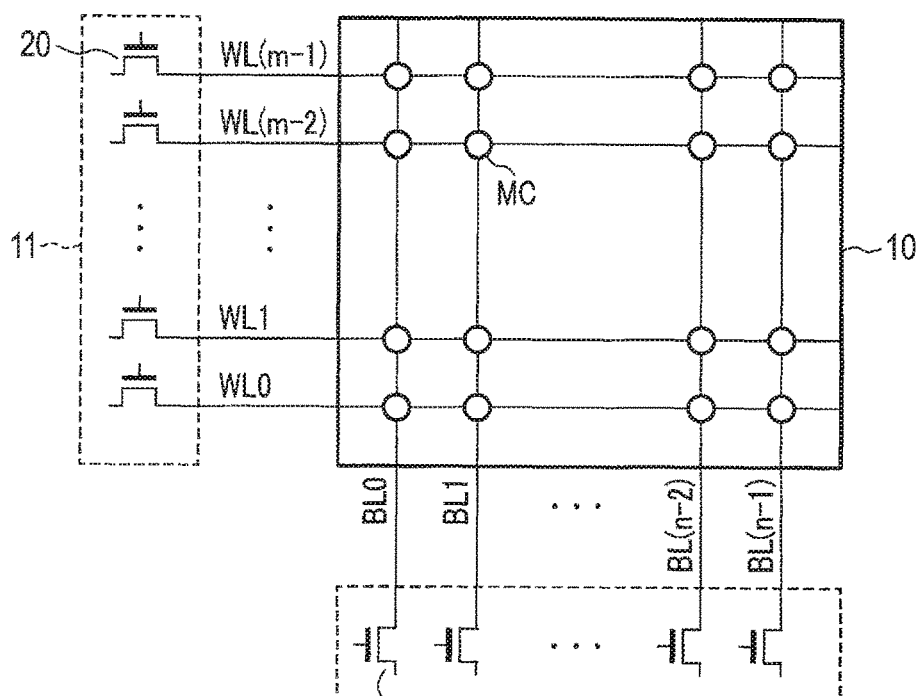
FIG. 3 is a circuit diagram of a memory cell array, a row selection unit, and a column select circuit shown in FIG. 2.

Next, the configuration of each memory unit MU included in a bank BK will be described. FIG. 2 is a block diagram of the memory unit MU shown in FIG. 1. FIG. 3 is a circuit diagram of a memory cell array 10, a row selection circuit 11, and a column selection circuit 12 shown in FIG. 2.

The memory unit MU includes the memory cell array 10, the row selection circuit 11, the column selection circuit 12, a write circuit 13, and a read circuit 14.

The memory cell array 10 includes a plurality of memory cells MC arranged in a matrix form. The memory cell array 10 is provided with a plurality of word lines WL0 to WL(m−1) each extending in a row direction, and a plurality of bit lines BL0 to BL(n−1) each extending in a column direction. One memory cell MC is disposed in a crossing region between one word line WL and one bit line BL and is connected to the word line WL and the bit line BL.

The row selection circuit 11 is connected to the plurality of word lines WL0 to WL(−1). The row selection circuit 11 receives a row address RA from the decoding circuit 15. The row selection circuit 11 includes a plurality of select transistors (select elements) 20 that are respectively connected to the plurality of word lines WL0 to WL(m−1). The select transistors 20 are formed, for example, of N channel MOS transistors. The row selection circuit 11 selects a corresponding word line WL by turning on a select transistor 20 corresponding to a row designated by a row address RA. The gate of the select transistor 20 is connected to a row select line (not unillustrated).

The column selection circuit 12 is connected to the plurality of bit lines BL0 to BL(n−1). The column selection circuit 12 receives a column address CA from the decoding circuit 15. The column selection circuit 12 includes a plurality of select transistors (select elements) 21 that are respectively connected to the plurality of bit lines BL0 to BL(n−1). The select transistors 21 are formed, for example, of N channel MOS transistors. The column selection circuit 12 selects a corresponding bit line BL by turning on a select transistor 20 corresponding to a row designated by a column address CA. The gate of the select transistor 21 is connected to a column select line (not illustrated).

The write circuit 13 receives data DAT from the input/output circuit 16. The write circuit 13 writes data to a memory cell MC by causing a current to flow through the selected memory cell. The write circuit 13 includes, for example, a write driver (not illustrated).

The read circuit 14 reads data from a memory cell MC. The read circuit 14 reads data stored in the memory cell by detecting the current flowing through the selected memory cell. The read circuit 14 sends data DAT to the input/output circuit 16. The read circuit 14 includes a sense amplifier SA.

[1-1-1] Configuration of Memory Cell Array 10

Figure 4:
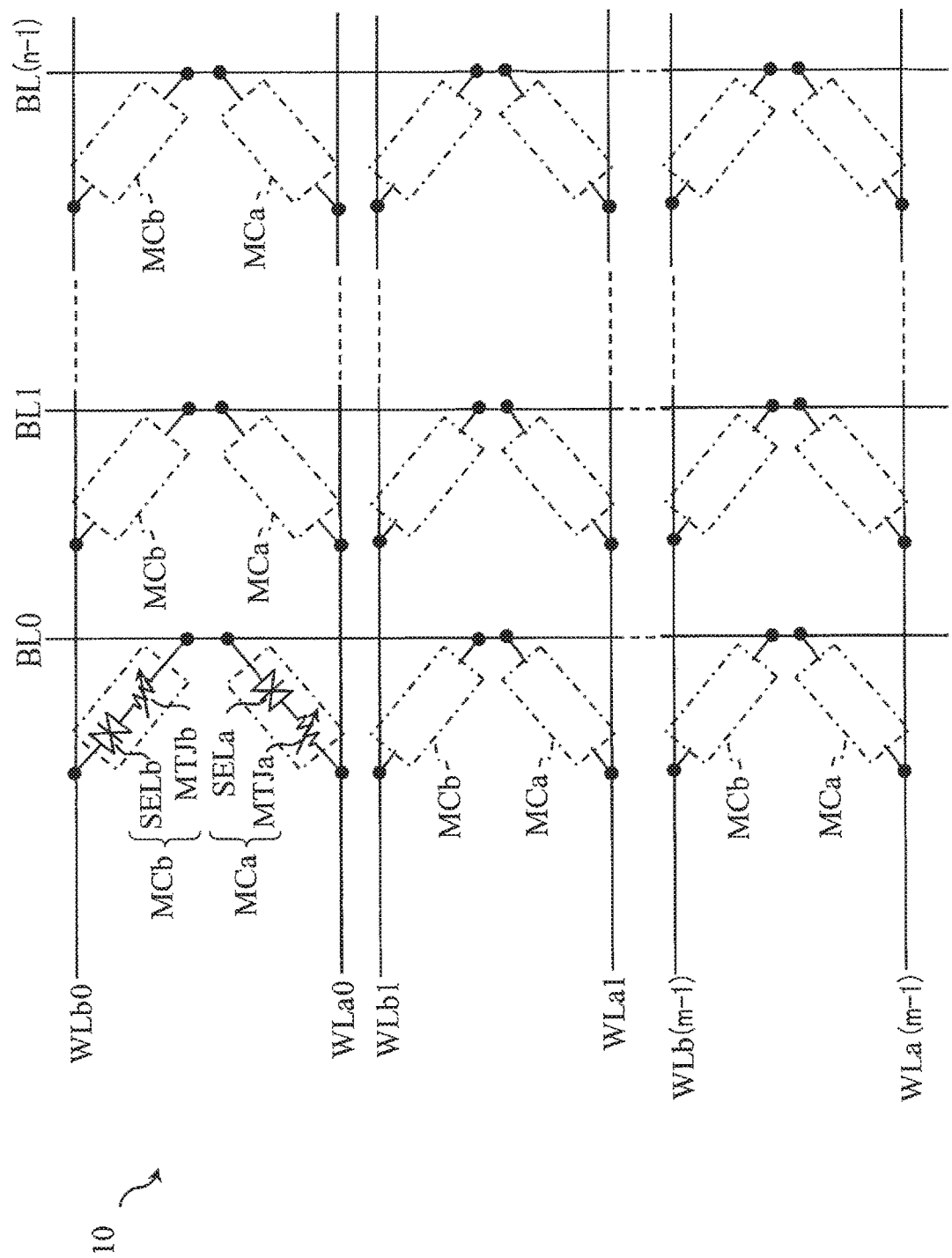
FIG. 4 is a circuit diagram of the memory cell array shown in FIG. 3.

The following is explanation of an example of the configuration of a memory cell array 10. FIG. 4 is a circuit diagram of the memory cell array 10 shown in FIG. 3.

In the configuration example of FIG. 4, a word line WL is classified into two types (WLa and WLb). A memory cell MC is classified into two types (MCa and Mob). Subscripts "a" and "b" are respectively provided to identify those provided downward relative to a bit line BL and those provided upward relative to the bit line BL, for descriptive purposes. An example of the stereoscopic configuration of the memory cell array 10 will be described later. In explanations common to a plurality of components each having a reference sign provided with a subscript, each of the components is expressed by the reference sign without providing the subscript.

A memory cell MCa is connected to one word line of a plurality of word lines WLa0 to WLa(m−1) and to one bit line of a plurality of bit lines BL0 to BL(n−1). A memory cell Mob is connected to one word line of the plurality of word lines WLb0 to WLb(m−1) and to one bit line of the plurality of bit lines BL0 to BL(n−1).

The memory cell MCa includes a selector (switching element) SELa and a magnetoresistive effect element MTJa that are connected in series. The memory cell MCb includes a selector witching element) SELb and a magnetoresistive effect element MTJb that are connected in series.

A selector SEL has a function as a switch that controls supply of a current to a corresponding magnetoresistive effect element MTJ when writing data to or reading data from the magnetoresistive effect element MTJ. More specifically, for example, when a voltage to be applied to a certain memory cell MC is smaller than a threshold voltage Vth, a selector SEL in the memory cell MC cuts off the current (enters the OFF state) as an insulator having a large resistance value, and when the voltage is equal to or more than the threshold voltage Vth, the selector SEL causes the current to flow as a conductor having a small resistive value (enters the ON state). That is, the selector SEL has a function to enable switching to cause a current to flow or cut off the current in accordance with the level of a voltage applied to a memory cell. MC, irrespective of a direction in which the current flows.

The magnetoresistive effect element MTJ can switch between a low-resistance state and a high-resistance state by a current whose supply is controlled by the selector SEL. The magnetic resistive effect element MTJ can write data depending on a change in the resistance state and functions as a memory element (magnetic tunnel junction (MTJ) element) that can store written data in an involatile manner and read the data.

(Cross-Sectional Structure)

Figure 5:
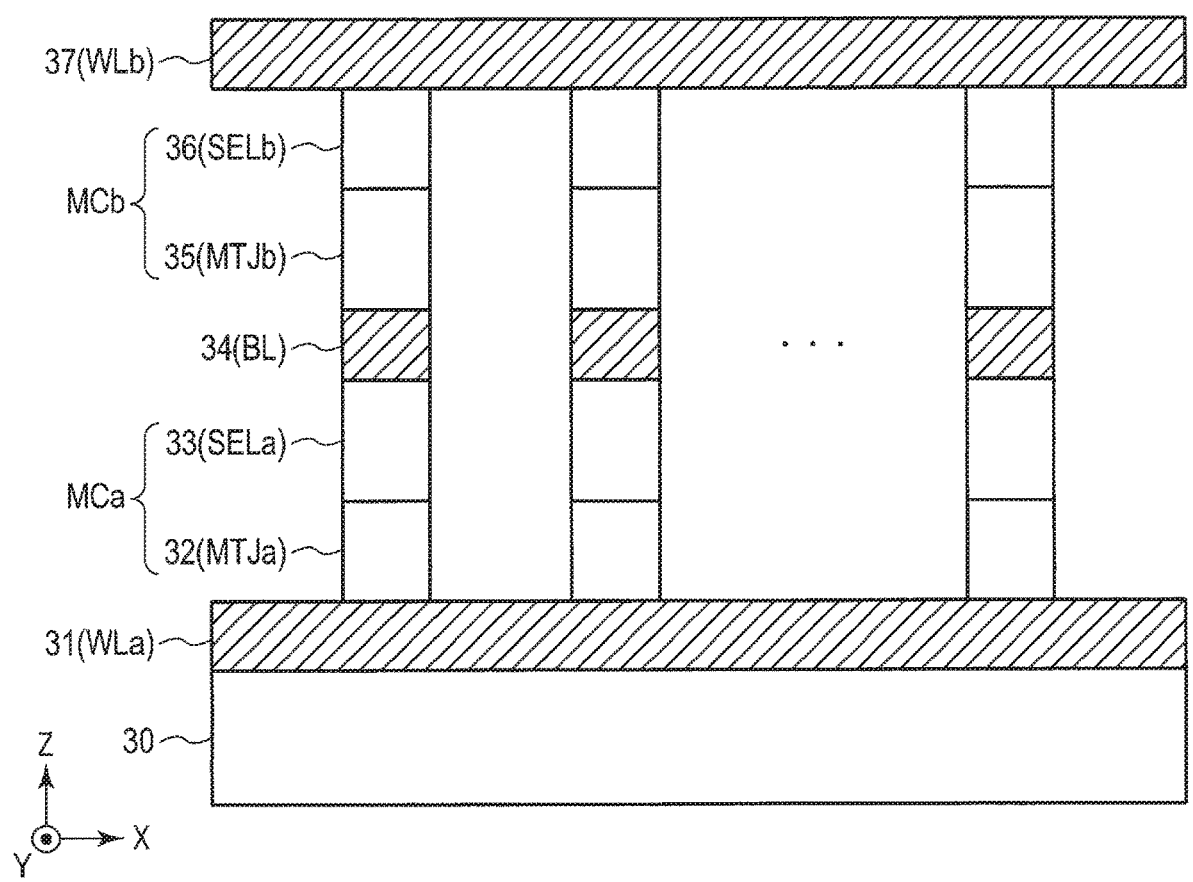
FIG. 5 is a cross-sectional diagram of a partial region of a memory cell array.

The following is explanation of an example of a cross-sectional structure of the memory cell array 10. FIG. 5 illustrates an example of a cross-sectional structure thereof along word lines.

The memory cell array 10 is provided on a substrate 30. The substrate 30 is formed, for example, of a semiconductor substrate. In the following explanation, a plane parallel with a surface of the semiconductor substrate 30 is denoted by an XY plane, and a direction perpendicular to the XY plane is denoted by a Z-direction. A direction along the word lines WL is denoted by an X-direction, a direction along the hit line BL is denoted by a Y-direction. The X-direction and the Y-direction are, for example, orthogonal to each other.

For example, a plurality of conductive layers 31 that function as word lines WLa are provided on the semiconductor substrate 30. The plurality of conductive layers 31 are arranged, for example, in parallel with the Y-direction, and each of them extends in the X-direction.

A plurality of elements 32 that function as magnetoresistive effect elements MTJa are provided on each of the plurality of conductive layers 31 along the X-direction. An element 33 that functions as a selector SELa is provided on each of the plurality of elements 32.

The element. 33 is, for example, a two-terminal (binary) switching element. When a voltage applied between a pair of terminals is less than a threshold voltage, the switching element can remain in a high-resistance state, e.g., an electrically non-conductive state. When a voltage applied to between the pair of terminals is equal to or greater than the threshold voltage, the switching element is in a low-resistance state, e.g., an electrically conductive state. The switching element can be configured to perform this function regardless of a polarity of the voltage. The switching element may have the above-mentioned functions bi-directionally. A plurality of conductive layers 34 that function as bit lines BL are respectively provided on the plurality of elements 33 arranged in the X-direction. The plurality of conductive layers 34 are arranged in parallel with the X-direction, and each of them extends in the Y-direction.

A plurality of elements 35 that function as magnetoresistive effect elements MTJb are provided on the respective conductive layers 34 along the Y-direction. An element 36 that functions as a selector SELb is provided on each of the plurality of elements 35. A plurality of conductive layers 37 that function as word lines WLb are provided on the plurality of elements 36 arranged in the Y-direction. A plurality of conductive layers 37 are arranged in parallel with the Y-direction, and each of them extends in the X-direction. The element 36 has the same function as the element 33.

Around the memory cells MCa and MCb, unillustrated insulation layers are provided.

By being configured as described above, the memory cell array 10 has a configuration where one memory cell MC can be selected by a combination of one bit line BL and one word line WL. Furthermore, the memory cell array 10 has a configuration where the memory cell arrays are disposed in the Z-direction.

A so-called three-terminal-type switching transistor as the switching element of the memory cell can be applied to the memory cell array as one embodiment.

[1-1-2] Configuration of Magnetoresistive Effect Element MTJ

The following is explanation of an example of the configuration of a magnetoresistive effect element MTJ. The magnetoresistive effect element MTJ includes a ferromagnetic layer 41 that functions as a reference layer (RL), a non-magnetic layer 42 that functions as a tunnel barrier layer (TB), and a ferromagnetic layer 43 that functions as a storage layer (SL). The ferromagnetic layer 41, non-magnetic layer 42, and the ferromagnetic layer 43 constitute a magnetic tunnel junction.

In the element 32 (MTJa), a plurality of materials, i.e., the ferromagnetic layer 41, non-magnetic layer 42, and ferromagnetic layer 43 are stacked in this order, for example, from the side of a word line WLa toward the side of a bit line EL (in the Z-direction). In the element 35 (MTJb), a plurality of materials, i.e., the ferromagnetic layer 41, non-magnetic layer 42, and ferromagnetic layer 43 are stacked in this order, for example, from the side of a bit line EL toward the side of a word line WLb (in the Z-direction). The magnetic resistance effect element MTJ functions as a perpendicular magnetization type MTJ element in which for example, the magnetization directions of the ferromagnetic layers 41 and 43 face a perpendicular direction relative to each of the film surfaces.

The ferromagnetic layer 41 has ferromagnetism and has an axis of easy magnetization which is perpendicular to the film surface. The ferromagnetic layer 41 has a magnetization direction heading toward either the side of bit lines BL or the side of word lines WL. The ferromagnetic layer 41 contains, for example, cobalt platinum (CoPt), cobalt nickel (CoNi), or cobalt palladium (CoPd). The magnetization direction of the ferromagnetic layer 41 is fixed, and in the example of FIG. 6, the magnetization direction thereof faces the side of the ferromagnetic layer 43. "The magnetization direction is fixed" means that a magnetization direction is not changed by a current (spin torque) having an intensity that can reverse the magnetization direction of the ferromagnetic layer 43.

The non-magnetic layer 42 has nonmagnetism and contains, for example, magnesium oxide (MgO).

The ferromagnetic layer 43 has ferromagnetism and has an axis of easy magnetization which is perpendicular to the film surface. The ferromagnetic layer 43 has a magnetization direction heading toward either the side of bit lines EL or the side of word lines WL. The ferromagnetism layer 43 contains, for example, cobalt iron boron (CoFeB) or iron horde (FeB). The magnetization direction of the ferromagnetic layer 43 is variable.

In the first embodiment, a spin-transfer torque writing method is adopted in which a write current is directly caused to flow into such a magnetoresistive effect element MTJ and a spin torque is injected into a storage layer SL by the write current to control the magnetization direction of the storage layer SL. The magnetoresistive effect element MTJ can take either a low-resistance state or a high-resistance state depending on whether the relative relationship of the magnetization direction between a storage layer SL and a reference layer RI is parallel or antiparallel.

When a write current having a certain intensity is caused to flow in the direction shown by an arrow A1 in FIG. 6, i.e., in a direction heading from the storage layer SL toward the reference layer RL, the relative relationship of the magnetization direction between the storage layer SL and the reference layer RL becomes parallel. In the case of this parallel state, the resistance value of the magnetoresistive effect element MTJ becomes small, and the magnetoresistive effect element MTJ is set into a low-resistance state. The low-resistance state is referred to as "P (Parallel) state", and is defined, for example, as a state of data "0".

When a write current that is larger than the write current when writing data "0" is caused to flow in the direction shown by an arrow A2 in FIG. 6, i.e., in a direction heading from the reference layer RL toward the storage layer SL, the relative relationship of the magnetization direction between the storage layer SL and the reference layer RL becomes antiparallel. In the case of the antiparallel state, the resistance value of the magnetoresistive effect element MTJ increases, and the magnetoresistive effect element MTJ is set into a high-resistance state. The high-resistance state is referred to as "Anti-Parallel (AP-state)", and is defined, for example, as a state of data "1".

In the following description, embodiments will be explained in accordance with the data defining method described above; however, the way of defining data "1" and data "0" is not limited to the example described above. For example, the P-state may be defined as data "1", and the AP-state may be defined as data "0".

[1-2] Power Consumption of Memory Cell Array 10

Figure 7:
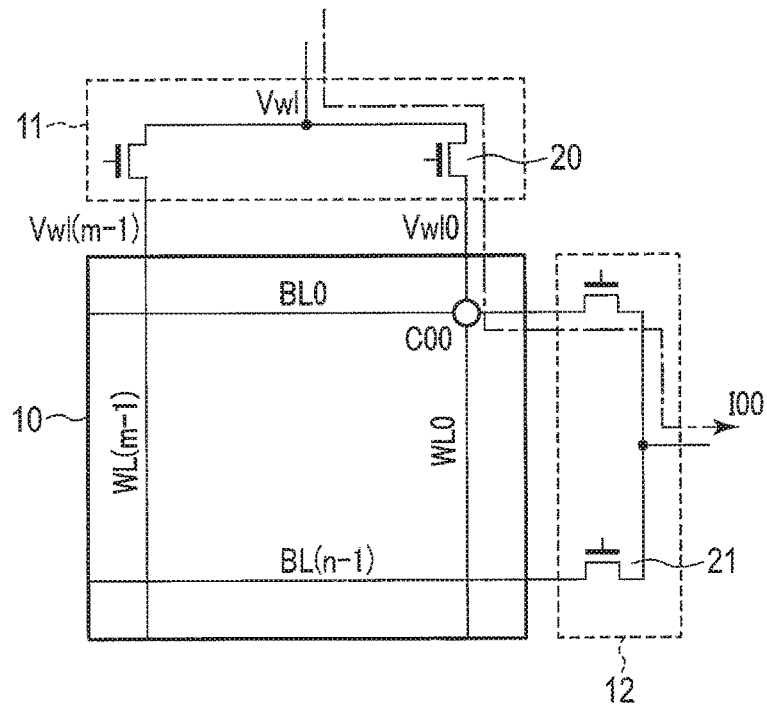
FIG. 7 is a diagram illustrating power consumption in the case of selecting a near cell.

The following is explanation of power consumption of the memory cell array 10. FIG. 7 is a diagram illustrating the power consumption in the case of selecting a near cell. The near cell is a memory cell that is the closest to both the row selection circuit 11 and the column selection circuit 12. That is, the near cell is a memory cell connected to a word line WL0 and a bit line BL0. Hereinafter, the sign of a memory cell may be sometimes simplified and denoted by "C", and the position of a memory cell is denoted by a two-digit numerical value that follows "C". The numerical values of a two-digit numerical value are placed in the order of a row number (word line number) and a column number (bit line number) from the left. A near cell is denoted as C00. FIG. 7 illustrates the near cell so that word lines WL extend in the longitudinal direction, and bit lines BL extend in the lateral direction.

Figure 8:
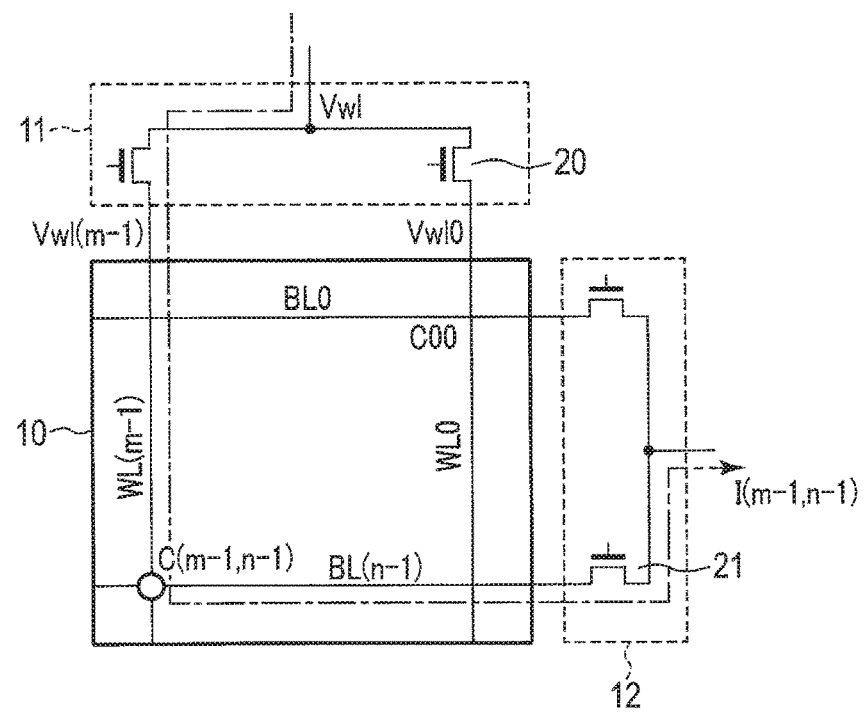
FIG. 8 is a diagram illustrating power consumption in the case of selecting a far cell.

FIG. 8 is a diagram illustrating power consumption in the case of selecting a far cell. The far cell is a memory cell that is the farthest from both the row selection circuit 11 and the column selection circuit 12. That is, the far cell is a memory cell C (m−1, n−1) connected to a word line WL(m−1) and a bit line EL(n−1).

It is assumed that a voltage Vw1 is applied to select transistor 20 included in the row selection circuit 11, and a current flows into a bit line BL from a word line WL via a memory cell. The voltage of a word line WL0 when a memory cell C00 is selected is defined as a voltage Vw10, and the voltage of a word line WL(m−1) when the memory cell C(m−1, n−1) is selected is defined as a voltage Vw1(m−1) The cell current when the memory cell C00 is selected is defined as a cell current T00, and the cell current when the memory cell C(m−1, n−1) is selected is defined as a cell current I(m−1, n−1).

When the memory cell C00 in FIG. 7 is selected, a word line WL and a bit line BL that go through the memory cell C00 are shortened, and the interconnection resistance decreases as well. On the other hand, when the memory cell C(m−1, n−1) in FIG. 8 is selected, a word line WL and a bit line BL that go through the memory cell C(m−1, n−1) are lengthened, and the interconnection resistance increases as well. If the cell current I00 of the memory cell C00 is equal to the cell current I(m−1, n−1) of the memory cell C(m−1, n−1), the voltage Vw10 when the memory cell C00 is selected and the voltage Vw1(m−1) when the memory cell C(m−1, n−1) is selected have a relationship. "Vw10<Vw1(m−1)". The power consumption varies in accordance with the interconnection resistance. Accordingly, the power consumption greatly varies in accordance with the position of a memory cell selected.

Furthermore, in the present embodiment, a plurality of memory units MU can be selected at the same time. The difference in power consumption increases between, for example, a case where the memory cells C00 are selected in all of 128 memory units MU and a case where the memory cells C(m−1, n−1) are selected in all of 128 memory units.

Then, in the present embodiment, the maximum power consumption when a plurality of memory cell units MU operate in parallel is reduced by reducing variations in power consumption that vary according to a row address and a column address.

[1-3] Operation

The following is explanation on the operation of the semiconductor memory device 1. First, a selection operation of a bank BK will be explained. The selection operations (including selection of a bank, a memory cell array, and a memory cell) in this specification include a selection operation in a write operation and a selection operation in a read operation.

Figure 9:
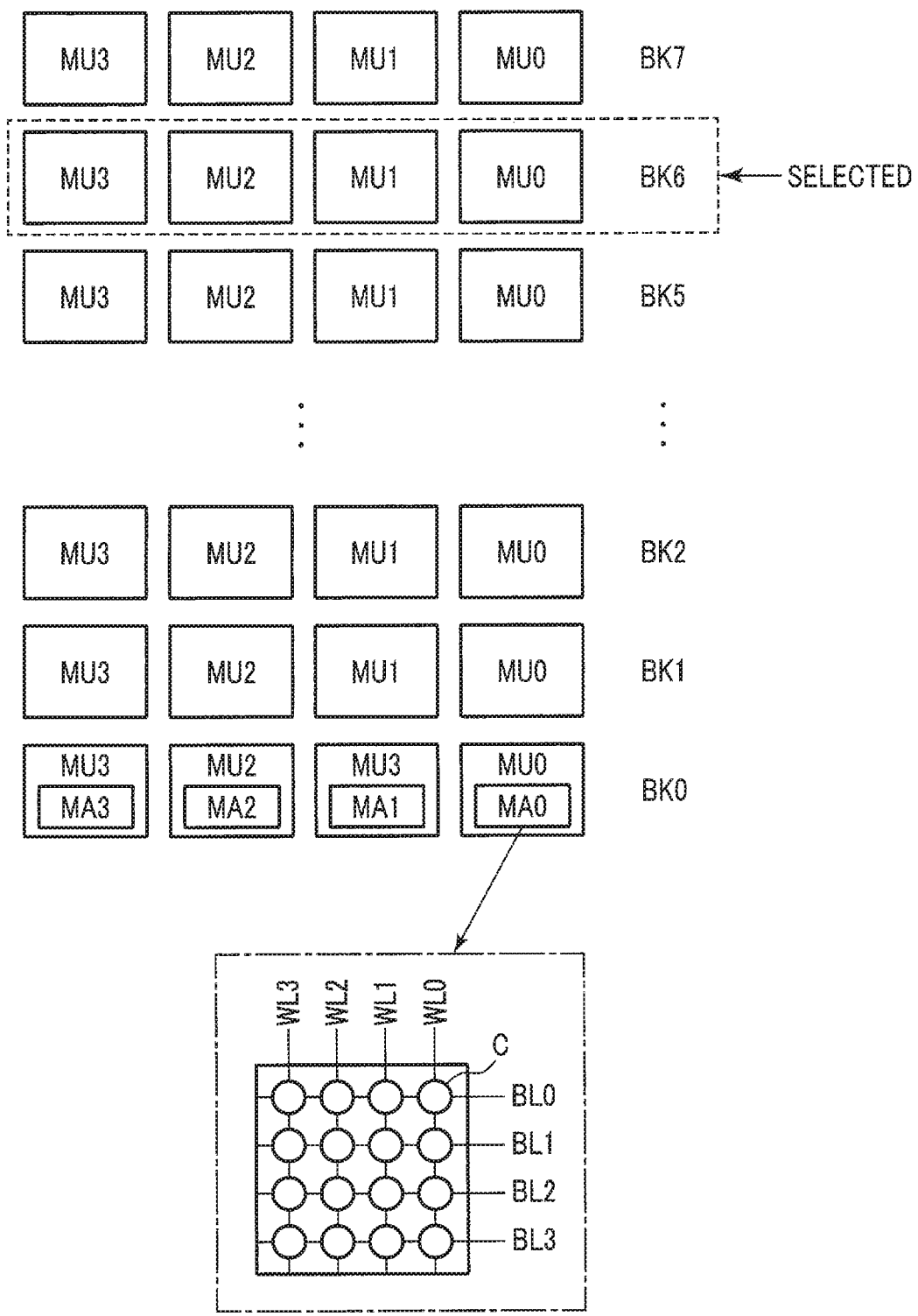
FIG. 9 is a diagram illustrating a select operation of a bank.

FIG. 9 is a diagram illustrating a selection operation of a bank BK. The semiconductor memory device 1 includes a plurality of banks BK. FIG. 9 exemplifies eight banks BK0 to BK7. Each of the banks BK includes a plurality of memory units MU. For simplification, FIG. 9 and the following explanation illustrate an example where one bank BK includes four memory units MU0 to MU3. Each of the memory units MU includes a memory cell array 10. In FIG. 9 and the following explanation, memory cell arrays respectively provided to the memory units MU0 to MU3 are denoted by "MA0 to MA3" for the sake of convenience.

In the present embodiment, in a write operation and a read operation, any one of the plurality of banks is selected. A bank BK to be selected is designated by a bank address generated by the decoding circuit 15. As shown in FIG. 9, it is assumed that a bank BK6 is selected, for example. The four memory units MU0 to MU3 included in the selected bank BK are operable in parallel. In FIG. 9 and the following explanation, for the purpose of simplification, it is assumed that four word lines WL0 to WL3 and four bit lines BL0 to BL3 are provided in one memory cell array MA, and the memory cell array MA includes 4×4 memory cells C.

[1-3-1] Example 1-1

A selection operation of a memory unit MU according to Example 1-1 will be described below.

FIGS. 10A to 10D are diagrams illustrating a selection operation of a memory unit MU according to Example 1-1. FIGS. 10A to 10D illustrate memory cell arrays MC to MA3, row selection circuits 11-0 to 11-3, and column selection circuits 12-0 to 12-3 which are respectively included in four memory units MU0 to MU3. In each of the memory cell arrays MA, only a selected memory cell C is illustrated.

Each of the row selection circuits 11-0 to 11-3 receives an identical row address RA from the decoding circuit 15 and selects any one of a plurality of word lines WL using the identical row address RA. Each of the column selection circuits 12-0 to 12-3 receives an identical column address CA from the decoding circuit 15 and selects any one of a plurality of bit lines EL using the identical column address FIGS. 10A to 10D are Examples where a row address RA is fixed, and a column address CA is varied. In FIGS. 10A to 10D, the row address RA is zero, and the column address CA is varied from 0 to 3. Hereinafter, FIGS. 10A to 10D will be explained in this order.

FIG. 10A is a diagram illustrating a selection operation in the case where the row address RA is zero, and the column address CA is zero.

In a memory cell array MA0, a row selection circuit 11-0 selects a word line WL0, and the column selection circuit 12-0 selects a bit line BLU. With this operation, a memory cell C00 is selected. That is, the row selection circuit 11-0 selects a word line whose word line length from the selected memory cell to the row selection circuit is the shortest, and the column selection circuit 12-0 selects a bit line whose bit line length from the selected memory cell to the column selection circuit is the shortest.

In a memory cell array MA1, a row selection circuit 11-1 selects a word line WL1, and a column selection circuit 12-1 selects a bit line BL1. With this operation, memory cell C11 is selected.

In a memory cell array MA2, a row selection circuit 11-2 selects a word line WL2, and a column selection circuit 12-2 selects a bit line BLL. With this operation, a memory cell C22 is selected.

In a memory cell array MA3, a row selection circuit 11-3 selects a word line WL3, and a column selection circuit 12-3 selects a bit line BL3. With this operation, a memory cell C33 is selected. That is, the row selection circuit 11-3 selects a word line whose word line length from the selected memory cell to the row selection circuit is the longest, and the column selection circuit 12-3 selects a bit line whose bit line length from the selected memory cell to the column selection circuit is the longest.

As can be seen from FIG. 10A, when an identical row address is received, the row selection circuits 11-0 to 11-3 perform a selection operation so that the number of a word line sequentially increases. Also, when an identical column address is received, the column selection circuits 12-0 to 12-3 perform a selection operation so that the number of a bit line sequentially increases. In other words, adjacent row selection circuits 11 select adjacent word lines. Also, adjacent column selection circuits 12 select adjacent bit lines.

Figure 10B:
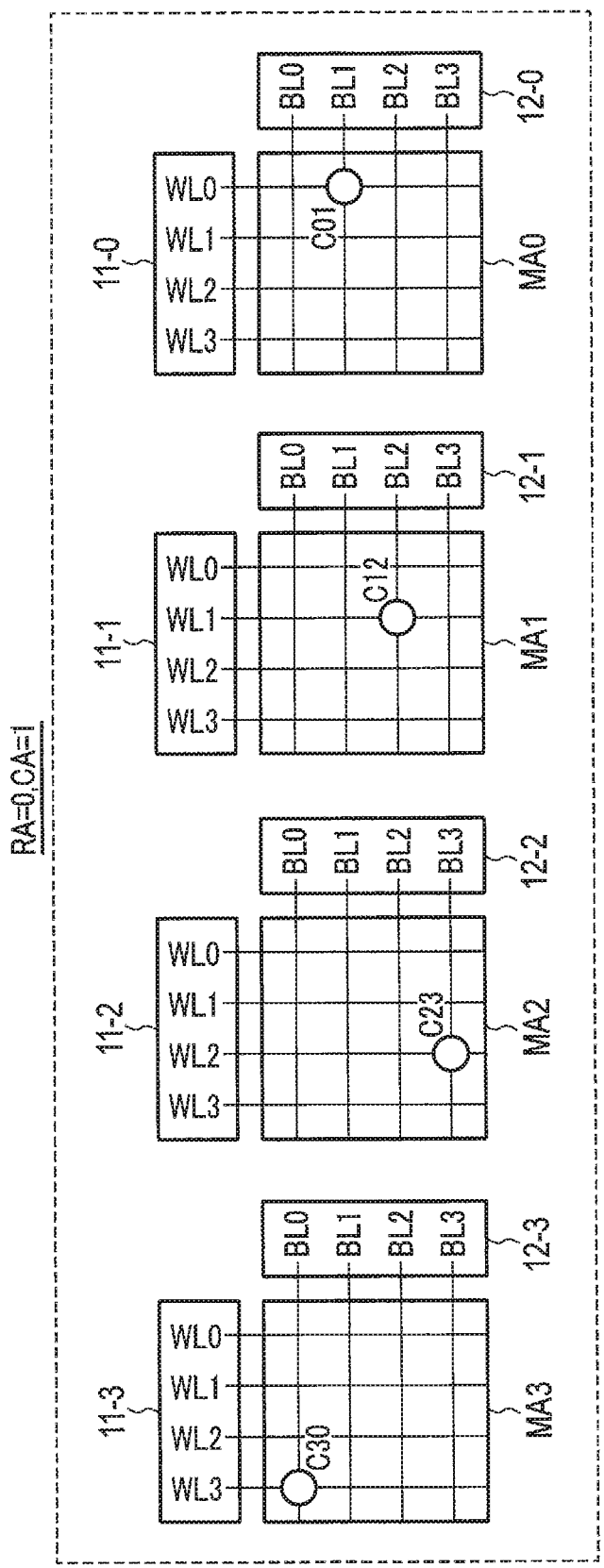
FIG. 10B is a diagram illustrating a select operation of the memory unit according to Example 1-1.

FIG. 10B is a diagram illustrating a selection operation in the case where the row address RA is zero, and the column address CA is 1.

In a memory cell array MA0, a row selection circuit 11-0 selects a word line WL0, and a column selection circuit 12-0 selects a bit line BL1. With this operation, a memory cell C01 is selected.

In a memory cell array MA1, a row selection circuit 11-1 selects a word line WL1, and a column selection circuit 12-1 selects a bit line BL2. With this operation, a memory cell C12 is selected.

In a memory cell array MA2, a row selection circuit 11-2 selects a word line WL2, and a column selection circuit 12-2 selects a bit line BL3. With this operation, a memory cell C23 is selected.

In a memory cell array MA3, a row selection circuit 11-3 selects a word line WL3, and a column selection circuit 12-3 selects a bit line BL0. With this operation, a memory cell C30 is selected.

Figure 10C:
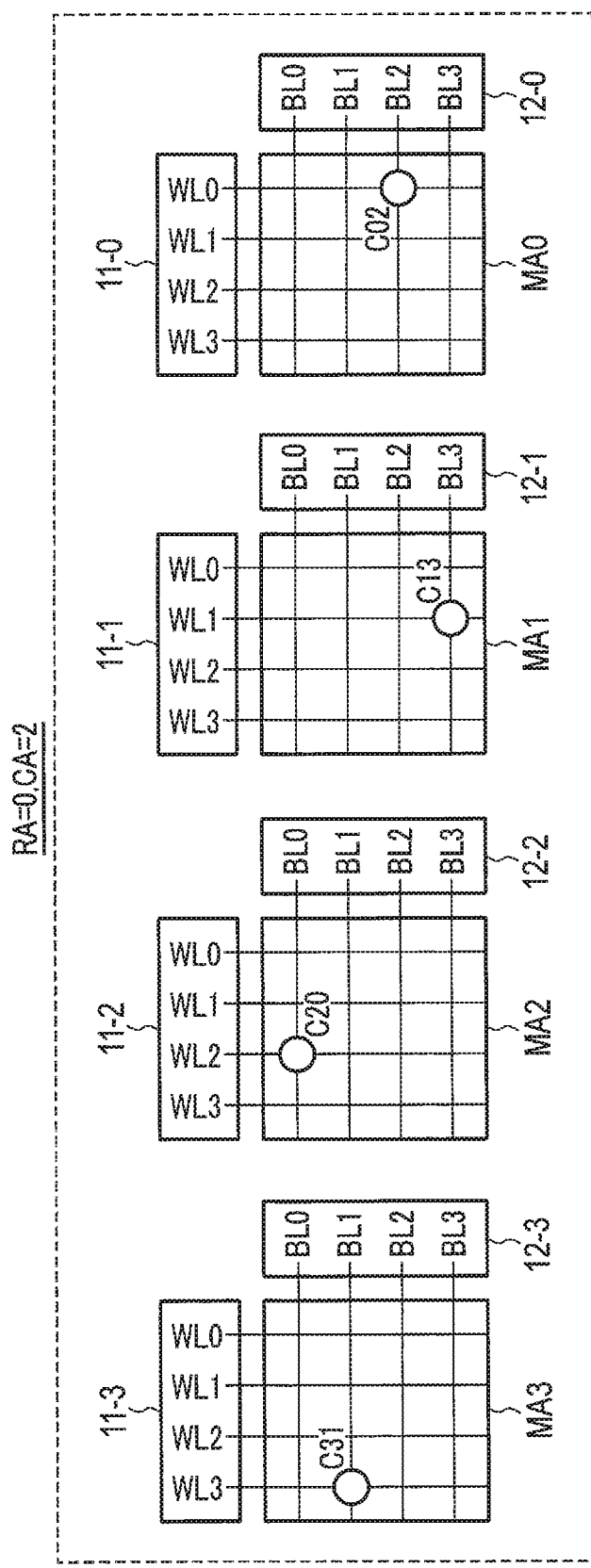
FIG. 10C is a diagram illustrating a select operation of the memory unit according to Example 1-1.

FIG. 10C is a diagram illustrating a selection operation in the case where the row address RA is zero, and the column address CA is 2.

In a memory cell array MA0, a row selection circuit 11-0 selects a word line WL0, and a column selection circuit 12-0 selects a bit line BL2. With this operation, a memory cell C02 is selected.

In a memory cell array MA1, a row selection circuit 11-1 selects a word line WL1, and a column selection circuit 12-1 selects a bit line BL3. With this operation, a memory cell C13 is selected.

In a memory cell array MA2, a row selection circuit 11-2 selects a word line WL2, and a column selection circuit 12-2 selects a bit line BL0. With this operation, a memory cell C20 is selected.

In a memory cell array MA3, a row selection circuit 11-3 selects a word line WL3, and a column selection circuit 12-3 selects a hit line BL1. With this operation, memory cell C31 is selected.

Figure 10D:
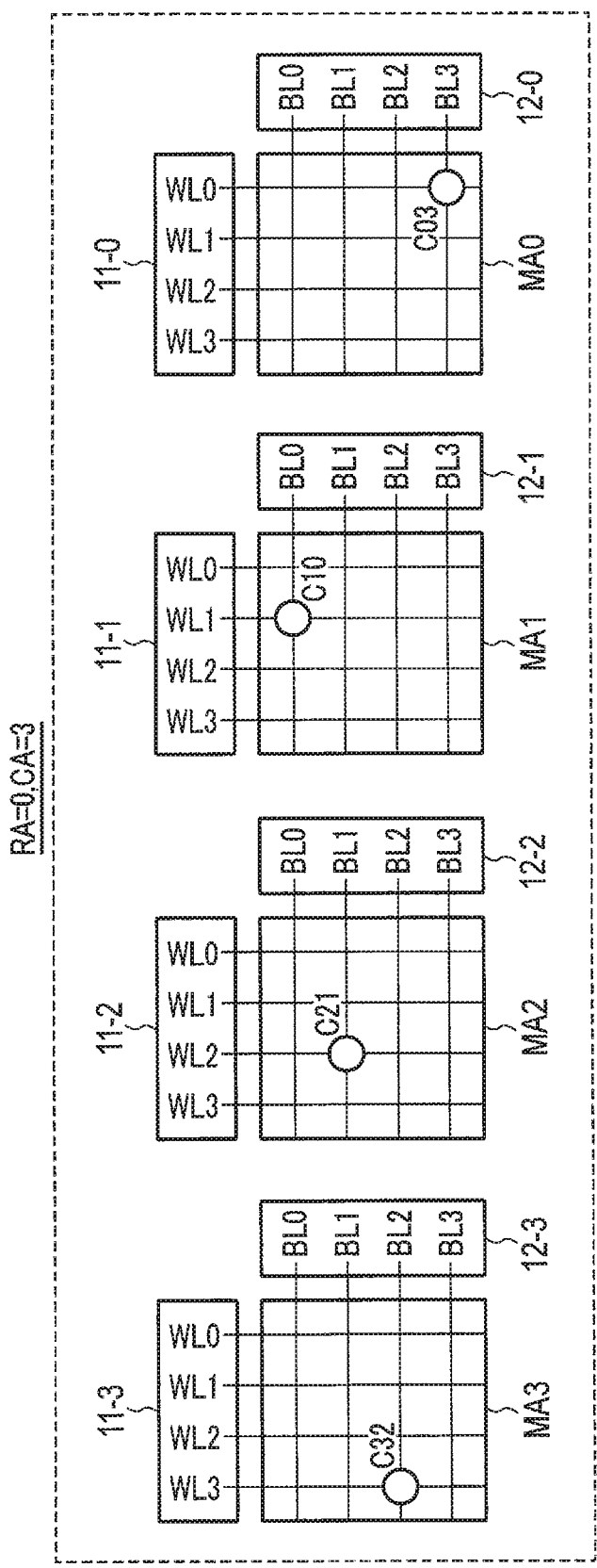
FIG. 10D is a diagram illustrating a select operation of the memory unit according to Example 1-1.

FIG. 10D is a diagram illustrating a selection operation in the case where the row address RA is zero, and the column address CA is 3.

In a memory cell array MA0, a row selection circuit 11-0 selects a word line WL0, and a column selection circuit 12-0 selects a bit line BL3. With this operation, a memory cell C03 is selected.

In a memory cell array MA1, a row selection circuit 11-1 selects a word line WL1, and a column selection circuit 12-1 selects a bit line BL0. With this operation, a memory cell C10 is selected.

In a memory cell array MA2, a row selection circuit 11-2 selects a word line WL2, and a column selection circuit 12-2 selects a bit line BL1. With this operation, memory cell C21 is selected.

In a memory cell array MA3, a row selection circuit 11-3 selects a word line WL3, and a column selection circuit 12-3 selects a bit line B12. With this operation, a memory cell C32 is selected.

As described above, when four memory units MU0 to MU3 included in one bank BK receive an identical row address RA and an identical column address CA, word lines whose word line lengths are long and whose word line lengths are short from the row selection circuit 11 to a selected memory cell, and bit lines whose bit line lengths are long and whose bit line lengths are short from the column selection circuit 12 to a selected memory cell are evenly selected. With this operation, cell currents are equalized across a plurality of memory units MU selected with one address, and variations in power consumption caused by the address are reduced.

The above-mentioned selection operations can be achieved by changing interconnection (connecting relation) of, for example, a row select line (not illustrated) connected to a gate of a row select transistor. Similarly, the selection operations can be achieved by changing interconnection (connecting relation) of, for example, a column select line (not illustrated) connected to a gate of a column select transistor. The same applies to the following selection operations.

[1-3-2] Example 1-2

A selection operation of memory units MU according to Example 1-2 will be explained below.

FIGS. 11A to 11D are diagrams illustrating a selection operation of memory units MU according to Example 1-2. In FIGS. 11A to 11D, the row address RA is 1, and the column address CA is varied from 0 to 3. Hereinafter, FIG. 11A to 11D will be explained in this order.

FIG. 11A is a diagram illustrating a selection operation in the case where the row address RA is 1, and the column address CA is zero.

In a memory cell array MA0, a row selection circuit 11-0 selects a word line WL1, and a column selection circuit 12-0 selects a bit line EL0. With this operation, a memory cell C10 is selected.

In a memory cell array MA1, a row selection circuit 11-1 selects a word line WL2, and a column selection circuit 12-1 selects a bit line EL1. With this operation, a memory cell C21 is selected.

In a memory cell array MA2, a row selection circuit 11-2 selects a word line WL3, and a column selection circuit 12-2 selects a hit line BL2. With this operation, a memory cell C32 is selected.

In a memory cell array MA3, a row selection circuit 11-3 selects a word line WL0, and a column selection circuit 12-3 selects a hit line BL3. With this operation, a memory cell C03 is selected.

Figure 11B:
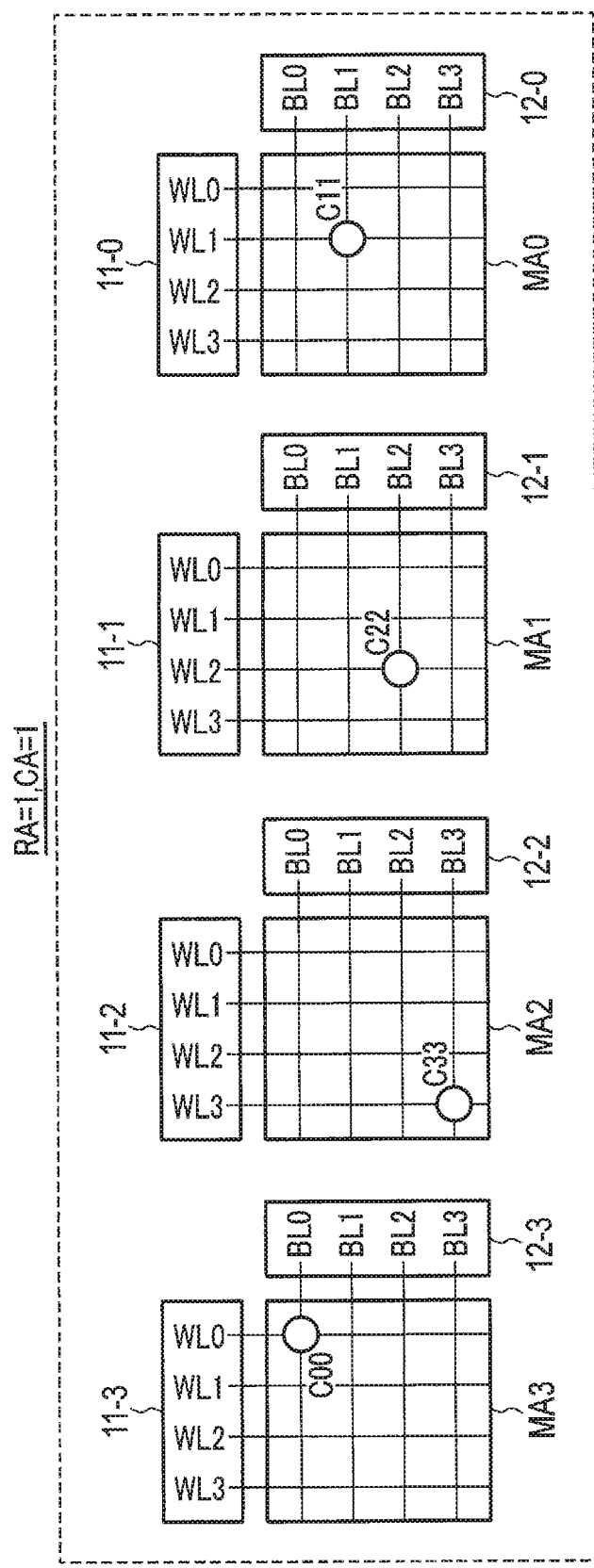
FIG. 11B is a diagram illustrating a select operation of a memory unit according to Example 1-2.

FIG. 11B is a diagram illustrating a selection operation in the case where the row address is 1, and the column address CA is 1.

In a memory cell array MA0, a row selection circuit 11-0 selects a word line WL1, and a column selection circuit 12-0 selects a hit line BL1. With this operation, memory cell C11 is selected.

In a memory cell array MA1, a row selection circuit 11-1 selects a word line WL2, and a column selection circuit 12-1 selects a bit line BL2. With this operation, a memory cell. C22 is selected.

In a memory cell array MA2, a row selection circuit 11-2 selects a word line WL3, and a column selection circuit 12-2 selects a bit line BL3. With this operation, a memory cell C33 is selected.

In a memory cell array MA3, a row selection circuit 11-3 selects a word line WL0, and a column selection circuit 12-3 selects a bit line BL0. With this operation, a memory cell C00 is selected.

Figure 11C:
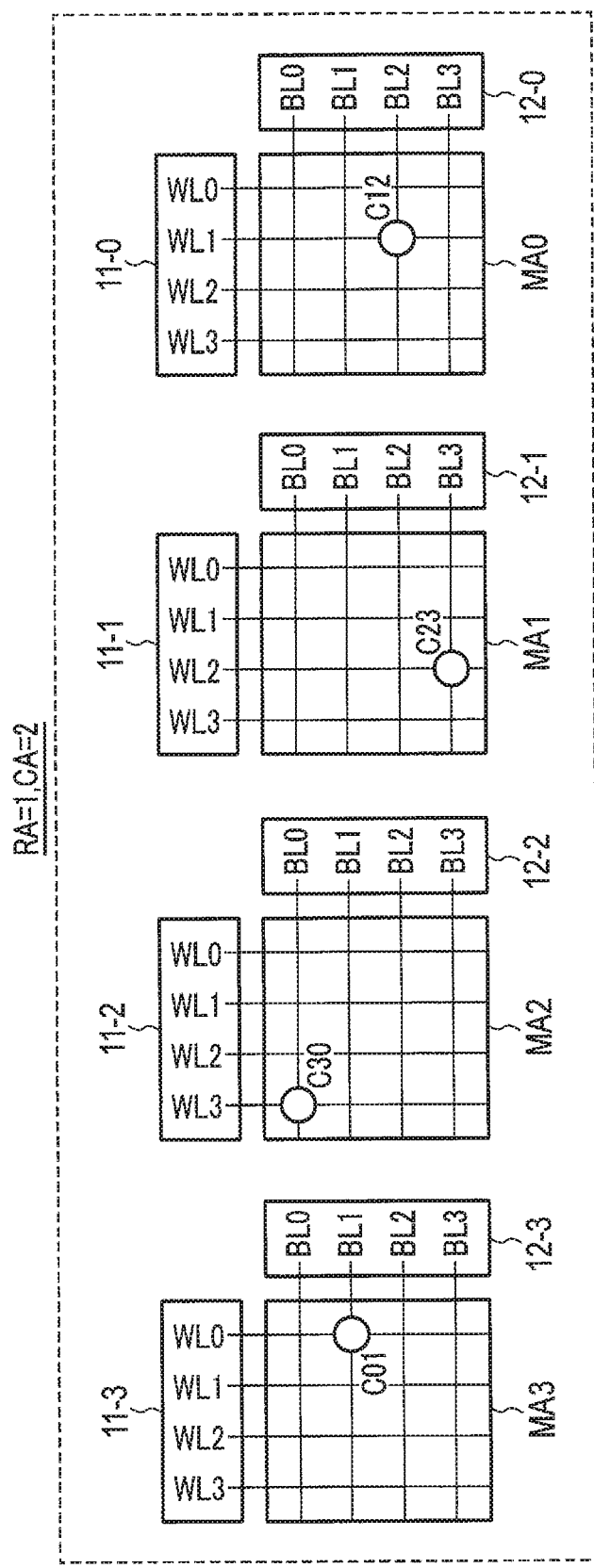
FIG. 11C is a diagram illustrating a select operation of the memory unit according to Example 1-2.

FIG. 11C is a diagram illustrating a selection operation in the case where the row address RA is 1, and the column address CA is 2.

In a memory cell array MA0, a row selection circuit 11-0 selects a word line WL1, and a column selection circuit 12-0 selects a bit line BL2. With this operation, memory cell C12 is selected.

In a memory cell array MA1, a row selection circuit 11-1 selects a word line WL2, and a column selection circuit 12-1 selects a bit line BL3. With this operation, a memory cell C23 is selected.

In a memory cell array MA2, a row selection circuit 11-2 selects a word line WL3, and a column selection circuit 12-2 selects a bit line BL0. With this operation, memory cell C30 is selected.

In a memory cell array MA3, a row selection circuit 11-3 selects a word line WL0, and a column selection circuit 12-3 selects a bit line BL1. With this operation, memory cell C01 is selected.

Figure 11D:
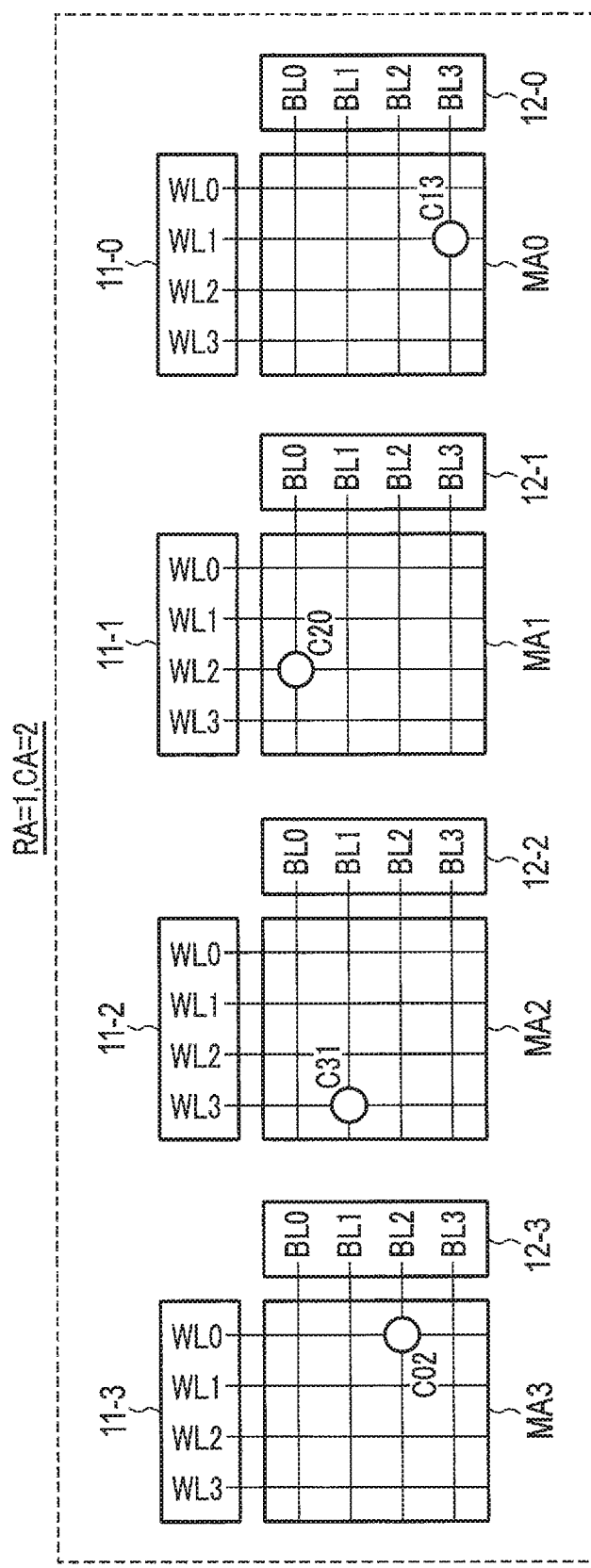
FIG. 11D is a diagram illustrating a select operation of the memory unit according to Example 1-2.

FIG. 11D is a diagram illustrating a selection operation in the case where the row address PA is 1, and the column address CA is 3.

In a memory cell array MA0, a row selection circuit 11-0 selects a word line WL1, and a column selection circuit 12-0 selects a bit line BL3. With this operation, a memory cell C13 is selected.

In a memory cell array MA1, a row selection circuit 11-1 selects a word line WL2, and a column selection circuit 12-1 selects a bit line BL0. With this operation, a memory cell C20 is selected.

In a memory cell array MA2, a row selection circuit 11-2 selects a word line WL3, and a column selection circuit 12-2 selects a bit line BL1. With this operation, a memory cell C31 is selected.

In a memory cell array MA3, a row selection circuit 11-3 selects a word line WL0, and a column selection circuit 12-3 selects a bit line BL2. With this operation, a memory cell C02 is selected.

Also in Example 1-2, in one bank BK, word lines whose word line lengths are long and whose word line lengths are short from the row selection circuit 11 to a selected memory cell, and bit lines whose bit line lengths are long and whose bit line lengths are short from the column selection circuit 12 to a selected memory cell are evenly selected.

Similarly, in the case where the row address RA is 2, and the column address CA is varied from 0 to 3, a selection operation is performed so that the word line WL is shifted by one word line from the operation of Example 1-2. Also, when the row address RA is 3, a selection operation is performed under the same rule that described above.

[1-3-3] Example 1-3

A selection operation of memory units MU according to Example 1-3 will be explained below.

FIGS. 12A to 12D are diagrams illustrating a selection operation of memory units MU according to Example 1-3. FIGS. 12A to 12D are Examples where a column address CA is fixed, and a row address RA is varied. In FIGS. 12A to 12D, the column address CA is zero, and the row address RA is 0 to 3. Hereinafter, FIGS. 12A to 12D will be explained in this order.

FIG. 12A is a diagram illustrating a selection operation in the case where the row address RA is zero, and the column address CA is zero. This operation is the same as the operation, shown in FIG. 10A.

Figure 12B:
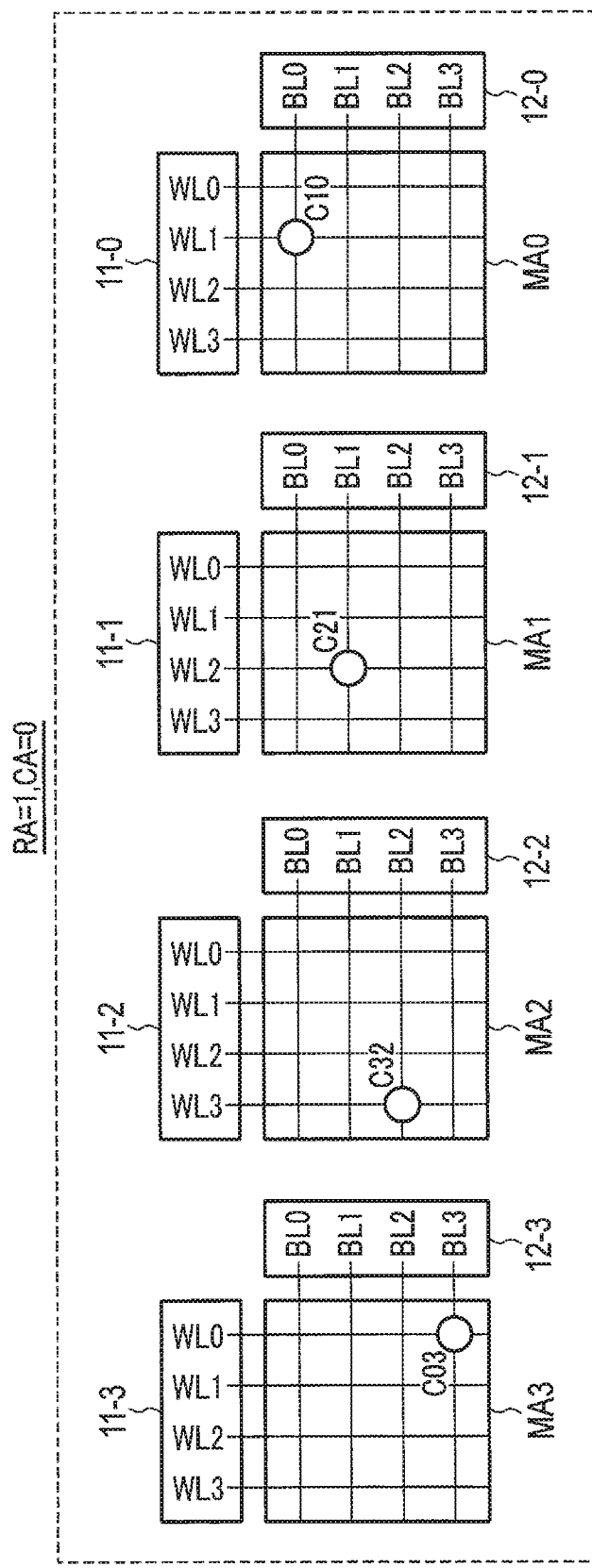
FIG. 12B is a diagram illustrating a select operation of the memory unit according to Example 1-3.

FIG. 12B is a diagram illustrating a selection operation in the case where the row address RA is 1, and the column address CA is zero.

In a memory cell array MA0, a row selection circuit 11-0 selects a word line WL1, and a column selection circuit 12-0 selects a bit line BLU. With this operation, a memory cell C10 is selected.

In a memory cell array MA1, a row selection circuit 11-1 selects a word line WL2, and a column selection circuit 12-1 selects a hit line BL1. With this operation, a memory cell C21 is selected.

In a memory cell array MA2, a row selection circuit 11-2 selects a word line WL3, and a column selection circuit 12-2 selects a bit line BL2. With this operation, memory cell C32 is selected.

In a memory cell array MA3, a row selection circuit 11-3 selects a word line WL0, and a column selection circuit 12-3 selects a hit line BL3. With this operation, a memory cell C03 is selected.

Figure 12C:
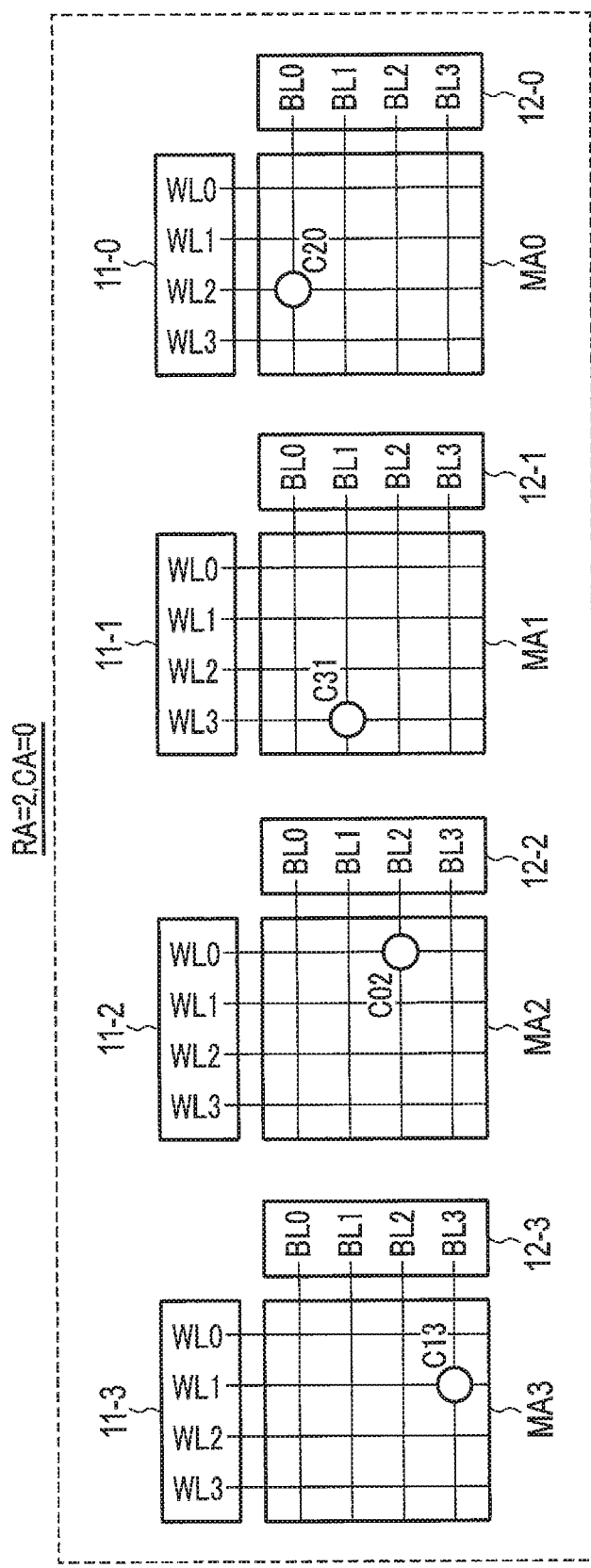
FIG. 12C is a diagram illustrating a select operation of the memory unit according to Example 1-3.

FIG. 12C is a diagram illustrating a selection operation in the case where the row address RA is 2, and the column address CA is zero.

In a memory cell array MA0, a row selection circuit 11-0 selects a word line WL2, and a column selection circuit 12-0 selects a bit line BL0. With this operation, a memory cell C20 is selected.

In a memory cell array MA1, a row selection circuit 11-1 selects a word line WL3, and a column selection circuit 12-1 selects a bit line BL1. With this operation, a memory cell C31 is selected.

In a memory cell array MA2, a row selection circuit 11-2 selects a word line WL0, and a column selection circuit 12-2 selects a bit line BL2. With this operation, a memory cell C02 is selected.

In a memory cell array MA3, a row selection circuit 11-3 selects a word line WL1, and a column selection circuit 12-3 selects a bit line BL3. With this operation, memory cell C13 is selected.

Figure 12D:
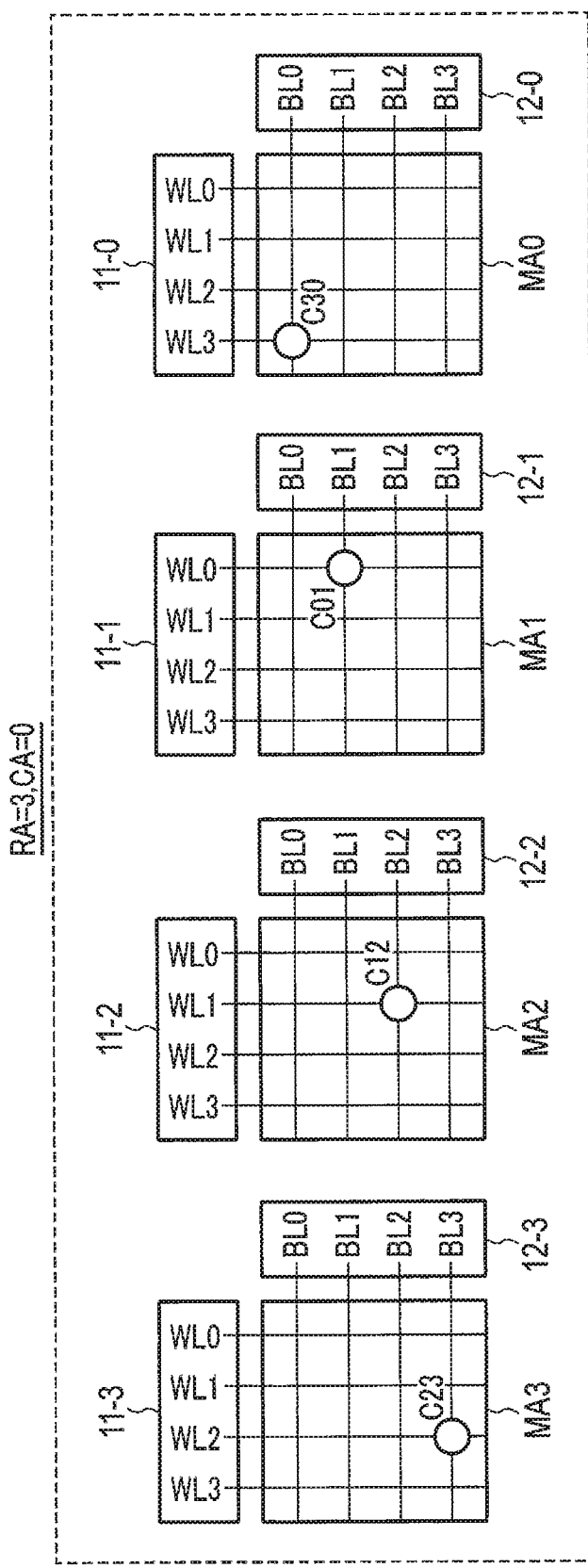
FIG. 12D is a diagram illustrating a select operation of the memory unit according to Example 1-3.

FIG. 12D is a diagram illustrating a selection operation in the case where the row address RA is 3, and the column address CA is zero.

In a memory cell array MA0, a row selection circuit 11-0 selects a word line WL3, and a column selection circuit 12-0 selects a bit line BL0. With this operation, a memory cell C30 is selected.

In a memory cell array MA1, a row selection circuit 11-1 selects a word line WL0, and a column selection circuit 12-1 selects bit line BL1. With this operation, a memory cell C01 is selected.

In a memory cell array MA2, a row selection circuit 11-2 selects a word line WL1, and a column selection circuit 12-2 selects a bit line EL2. With this operation, a memory cell C12 is selected.

In a memory cell array MA3, a row selection circuit 11-3 selects a word line WL2, and a column selection circuit 12-3 selects a bit line EL3. With this operation, a memory cell C23 is selected.

Also, in Example 1-3, in one bank BK, word lines whose word line lengths are long and whose word line lengths are short from the row selection circuit 11 to a selected memory cell, and bit lines whose bit line lengths are long and whose bit line lengths are short from the column selection circuit 12 to a selected memory cell are evenly selected Similarly, in the case where the column address CA is 1, and the row address RA is varied from 1 to 3, the selection operation is performed so that the bit line BL is shifted by one bit line from the operation of Example 1-3. Also, when the column address CA is 2 or 3, a selection operation is performed under the same rule as that described above.

[1-4] Effect of First Embodiment

As described in detail above, in the first embodiment, when an identical row address RA is received, the row selection circuits 11-0 to 11-3 perform selection operations of word lines so that word line lengths from selected memory cells to the row selection circuits vary. When an identical column address CA is received, the column selection circuits 12-0 to 12-3 perform selection operations of bit lines so that bit line lengths from the selected memory cells to the column selection circuits vary. Furthermore, four memory cells respectively selected within the memory cell arrays MA0 to MA3 differ in position within the arrays. That is, when an identical row address RA and an identical column address CA are received, a selection operation is performed so that memory cells selected within the memory cell arrays MA0 to MA3 are selected so that one word line WL and one bit line EL are shifted.

Therefore, according to the first embodiment, in the memory units MU0 to MU3 selected at the same time, variations in power consumption according to the addresses (including a row address RA and a column address CA) can be reduced. With this configuration, the maximum power consumption in simultaneously selected memory units MU0 to MU3 can be reduced.

[2] Second Embodiment

In a second embodiment, a plurality of memory units MU included in a bank BK are classified into two groups. Memory units included in each of the two groups perform the same selection operation. In the two groups, selection operations of word lines and bit lines are performed so that word line lengths and bit line lengths differ between the two groups.

[2-1] Configuration of Bank BK

Figure 13:
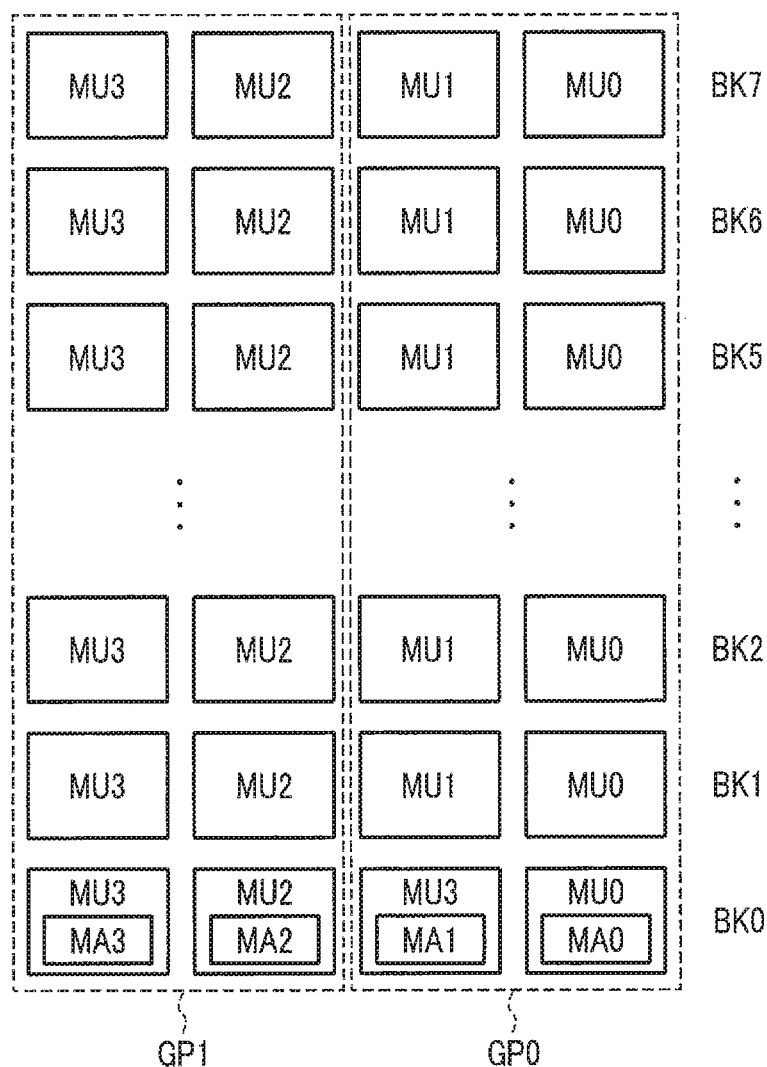
FIG. 13 is a diagram illustrating the configuration of a bank according to a second embodiment.

FIG. 13 is a diagram illustrating the configuration of banks BK according to the second embodiment. FIG. 13 exemplifies eight banks BK0 to BK7 and illustrates an example where one bank BK includes four memory units MU0 to MU3.

Of the memory units MU0 to MU3 included in the hank BK0, the memory units MU0 and MU1 belong to a group GP0, and the memory units MU2 and MU3 belong to a group GP1. The same applies to the banks BK1 to BK7.

The memory units MU0 and MU1 belonging to the group GP0 perform the same selection operation according to the addresses. The memory units MU2 and MU3 belonging to the group GP1 perform the same selection operation according to the addresses. In the group GP0 and the group GP1, selection operations that are different from each other are performed so that variations in power consumption caused by addresses can be reduced.

[2-2] Operation

The following is explanation on operations of the semiconductor memory device 1.

[2-2-1] Example 2-1

Selection operations of memory units MU according to Example 2-1 will be explained below. FIGS. 14A to 14D are diagrams illustrating a selection operation of memory units MU according to Example 2-1.

In FIGS. 14A to 14D, the row address RA is zero, and the column address CA is varied from 0 to 3. Hereinafter, FIGS. 14A to 14D will be explained in this order.

FIG. 14A is a diagram illustrating a selection operation in the case where the row address RA is zero, and the column address CA is zero.

In a memory cell array MA0, a row selection circuit 11-0 selects a word line WL0, and a column selection circuit 12-0 selects a bit line BL0. With this operation, a memory cell C00 is selected. That is, the row selection circuit 11-0 selects a word line whose word line length from a selected memory cell to the row selection circuit is the shortest, and the column selection circuit 12-0 selects a bit line whose bit line length from the selected memory cell to the column selection circuit is the shortest.

The selection operation of a memory cell array MA1 is the same as that of the memory cell array MA0.

In a memory cell array MA2, the row selection circuit 11-2 selects a word line WL3, and the column selection circuit 12-2 selects a bit line F3L3. With this operation, memory cell C33 is selected. That is, the row selection circuit 11-2 selects a word line whose word line length from a selected memory cell to the row selection circuit is the longest, and the column selection circuit 12-2 selects a bit line whose bit line length from the selected memory to the column selection circuit is the longest.

The selection operation of a memory cell array MA3 is the same as that of the memory cell array MA2.

Figure 14B:
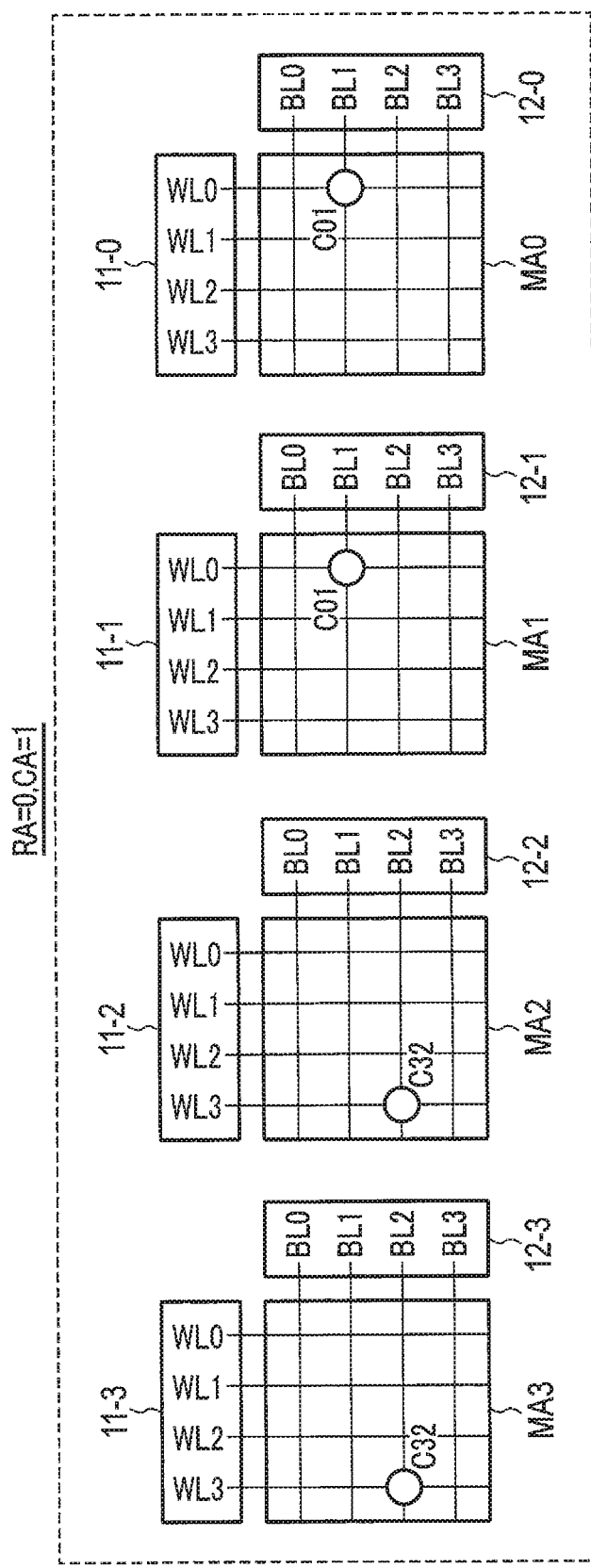
FIG. 14B is a diagram illustrating a select operation of a memory unit according to Example 2-1.

FIG. 14B is a diagram illustrating a selection operation in the case where the row address RA is zero, and the column address CA is 1.

In a memory cell array MA0, the row selection circuit 11-0 selects a word line WL0, and the column selection circuit 12-0 selects a bit line BL1. With this operation, a memory cell C01 is selected. The selection operation of a memory cell array MA1 is the same as that of the memory cell array MA0.

In a memory cell array MA2, the row selection circuit 11-2 selects a word line WL3, and the column selection circuit 12-2 selects a bit line BL2. With this operation, memory cell C32 is selected. The selection operation of a memory cell array MA3 is the same as that of the memory cell array MA2.

FIG. 14C is a diagram illustrating a selection operation in the case where the row address RA is zero, and the column address CA is 2.

In a memory cell array MA0, the row selection circuit 11-0 selects a word line WL0, and the column selection circuit 12-0 selects a bit line BL2. With this operation, a memory cell C02 selected. The selection operation of a memory cell array MA1 is the same as that of the memory cell array MA0.

In a memory cell array MA2, the row selection circuit 11-2 selects a word line WL3, and the column selection circuit 12-2 selects a bit line BL1. With this operation, a memory cell C31 is selected. The selection operation of a memory cell array MA3 is the same as that of the memory cell array MA2.

Figure 14D:
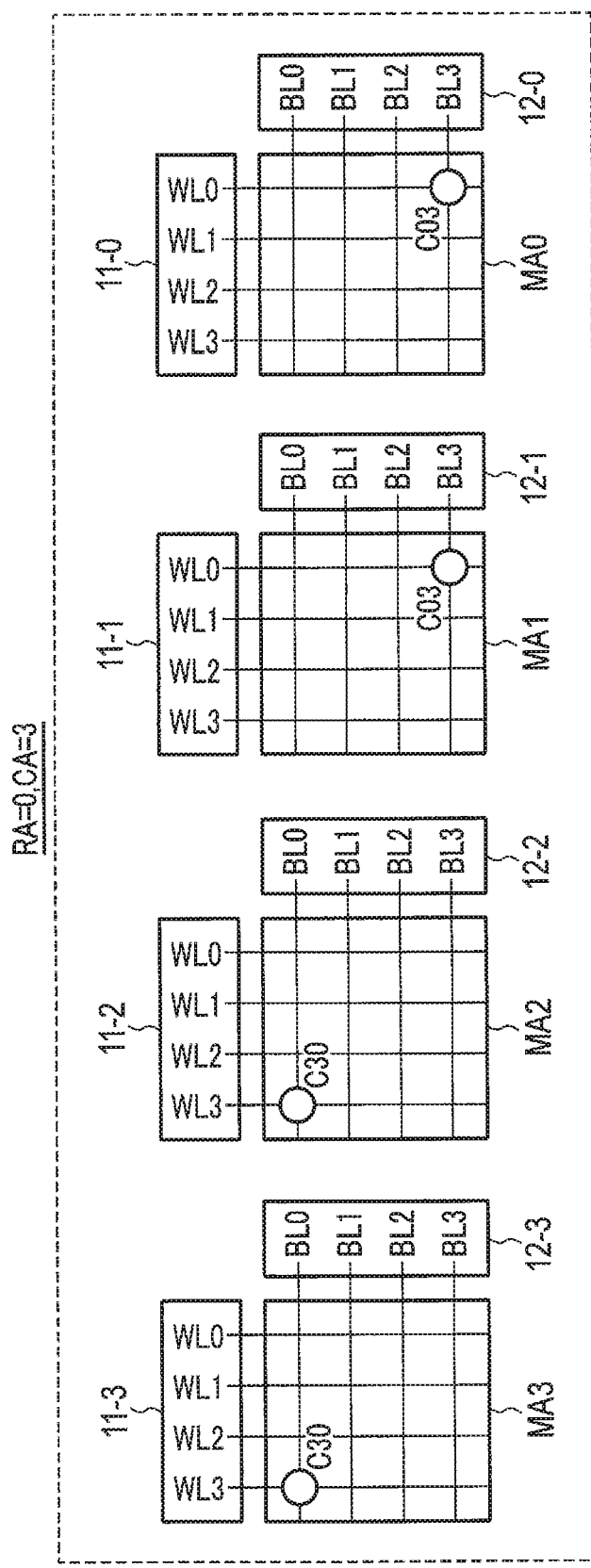
FIG. 14D is a diagram illustrating a select operation of the memory unit according to Example 2-1.

FIG. 14D is a diagram illustrating a selection operation in the case where the row address RA is zero, and the column address CA is 3.

In a memory cell array MA0, the row selection circuit 11-0 selects a word line WL0, and the column selection circuit 12-0 selects a bit line BL3. With this operation, a memory cell C03 is selected. The selection operation of the memory cell array MA1 is the same as that of the memory cell array MA0.

In a memory cell array MA2, the row selection circuit 11-2 selects a word line WL3, and the column selection circuit 12-2 selects a bit line BL0. With this operation, a memory cell C30 is selected. The selection operation of a memory cell array MA3 is the same as that of the memory cell array MA2.

Also in Example 2-1, in a bank BK, word lines whose word line lengths are long and whose word line lengths are short from the row selection circuit 11 to a selected memory cell, and bit lines whose bit line lengths are long and whose bit line lengths are short from the column selection circuit 12 to the selected memory cell are evenly selected.

Similarly, in the case where the row address RA is 1, and the column address CA is varied from 1 to 3, the selection operation is preformed so that the word line WL is shifted by one word line from the operation of Example 2-1.

[2-2-2] Example 2-2

Selection operations of memory units MU according to Example 2-2 will be explained. FIGS. 15A to 15D are diagrams illustrating a selection operation of memory units MU according to Example 2-2.

In FIGS. 15A to 15D, the row address PA is 2, and the column address CA is varied from 0 to 3. Hereinafter, FIGS. 15A to 15D will be explained in this order.

FIG. 15A is a diagram illustrating a selection operation in the case where the row address RA is 2 and the column address CA is zero.

In a memory cell array MA0, the row selection circuit 11-0 selects a word line WL2, and the column selection circuit 12-0 selects a bit line BL0. With this operation, memory cell C20 is selected. The selection operation of a memory cell array MA1 is the same as that of the memory cell array MA0.

In a memory cell array MA2, the row selection circuit 11-2 selects a word line WL1, and the column selection circuit 12-2 selects a bit line BL3. With this operation, a memory cell C13 is selected. The selection operation of a memory cell array MA3 is the same as that of the memory cell array MA2.

Figure 15B:
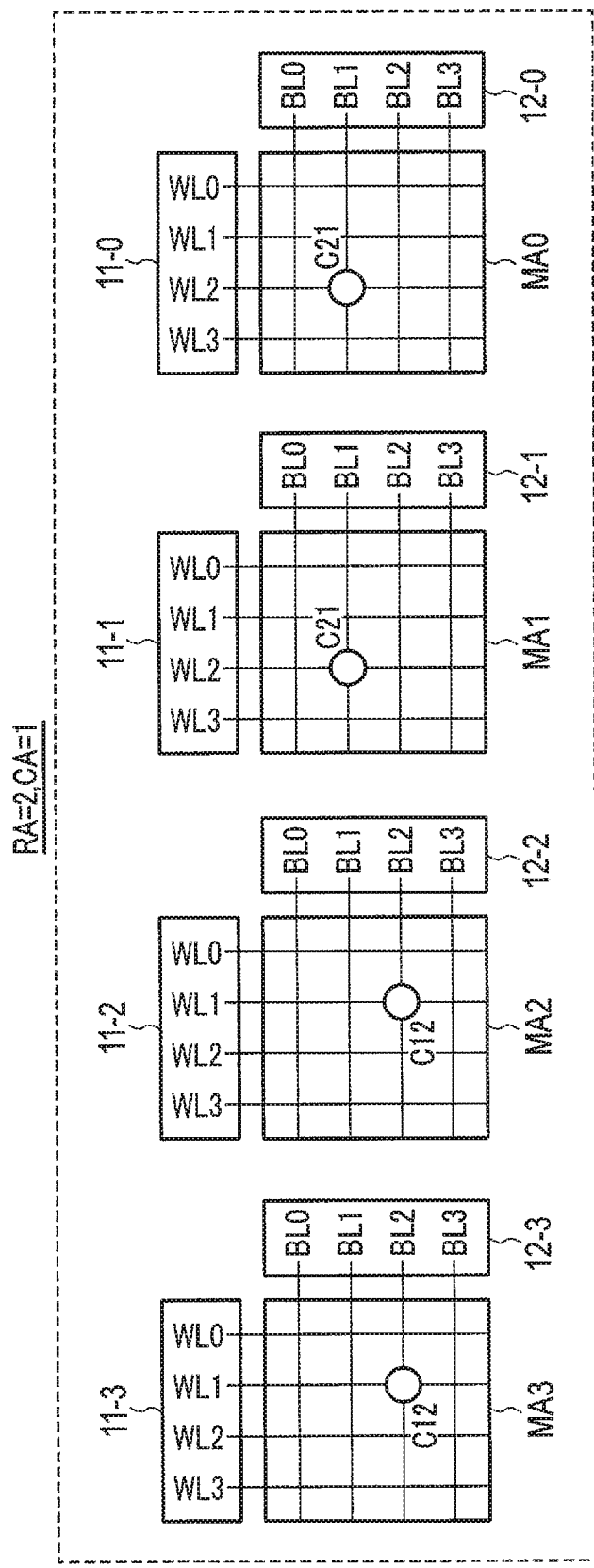
FIG. 15B is a diagram illustrating a select operation of the memory unit according to Example 2-2.

FIG. 15B is a diagram illustrating a selection operation in the case where the row address RA is 2 and the column address CA is 1.

In a memory cell array MA0, the row selection circuit. 11-0 selects a word line WL2, and the column selection circuit 12-0 selects a bit line BL1. With this operation, a memory cell C21 is selected. The selection operation of a memory cell array MA1 is the same as that of the memory cell array MA0.

In a memory cell array MA2, the row selection circuit 11-2 selects a word line WL1, and the column selection circuit 12-2 selects a bit line BL2. With this operation, a memory cell C12 is selected. The selection operation of a memory cell array MA3 is the same as that of the memory cell array MA2.

Figure 15C:
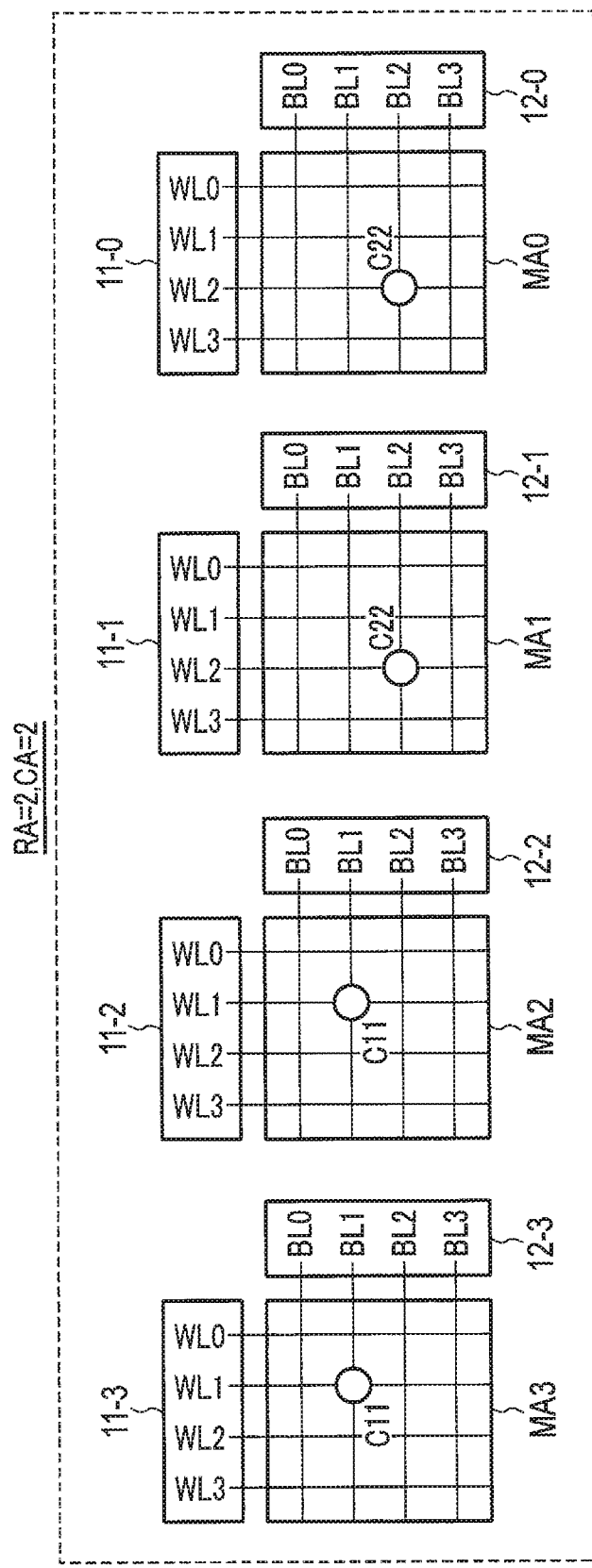
FIG. 15C is a diagram illustrating a select operation of the memory unit according to Example 2-2.

FIG. 15C is a diagram illustrating a selection operation in the case where the row address RA is 2 and the column address CA is 2.

In a memory cell array MA0, the row selection circuit 11-0 selects a word line WL2, and the column selection circuit 12-0 selects a bit line BL2. With this operation, memory cell C22 is selected. The selection operation of a memory cell array MA1 is the same as that of the memory cell array MA0.

In a memory cell array MA2, the row selection circuit 11-2 selects a word line WL1, and the column selection circuit 12-2 selects a bit line BL1. With this operation, a memory cell C11 is selected. The selection operation of a memory cell array MA3 is the same as that of the memory cell array MA2.

Figure 15D:
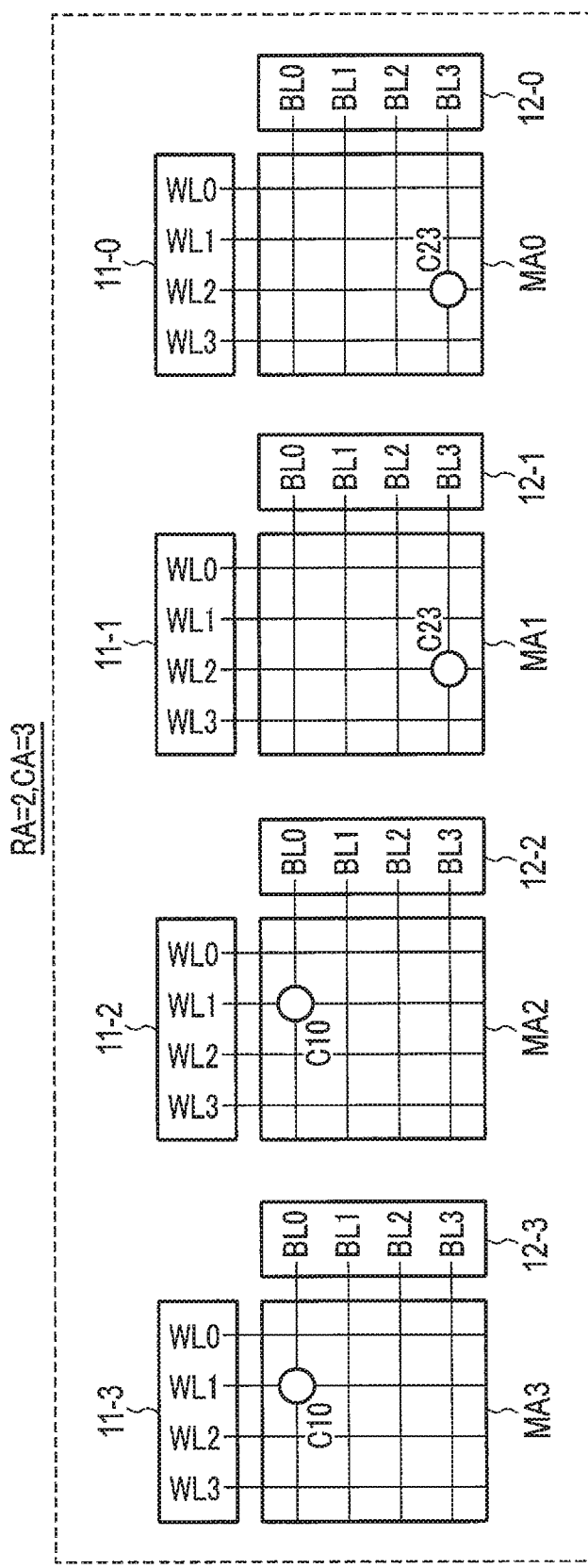
FIG. 15D is a diagram illustrating a select operation of the memory unit according to Example 2-2.

FIG. 15D is a diagram illustrating a selection operation in the case where the row address RA is 2 and the column address CA is 3.

In a memory cell array MA0, the row selection circuit 11-0 selects a word line WL2, and the column selection circuit 12-0 selects a bit line BL3. With this operation, a memory cell C23 is selected. The selection operation of a memory cell array MA1 is the same as that of the memory cell array MA0.

In a memory cell array MA2, the row selection circuit 11-2 selects a word line WL1, and the column selection circuit 12-2 selects a bit line BL0. With this operation, a memory cell C10 is selected. The selection operation of a memory cell array MA3 is the same as that of the memory cell array MA2.

Also in Example 2-2, in a bank BK, word lines whose word line lengths are long and whose word line lengths are short from the row selection circuit 11 to a selected memory cell, and bit lines whose bit line lengths are long and whose bit line lengths are short from the column selection circuit 12 to the selected memory cell are evenly selected.

Similarly, in the case where the row address RA is 3, and the column address CA is varied from 1 to 3, the selection operation is performed so that a word line WL is shifted by one word line from the operation of Example 2-2.

[2-3] Effect of Second Embodiment

In a second embodiment, for half of a plurality of simultaneously selected memory units MU with one address (group GP0), a selection operation of a word line and a bit line is performed so that the power consumption increases, and for the remaining half of the memory units (group GP1), a selection operation of a word line and a bit line is performed so that the power consumption decreases.

Therefore, according to the second embodiment, variations in power consumption can be reduced across the plurality of simultaneously selected memory units MU. With this configuration, the maximum power consumption of the plurality of simultaneously selected memory units MU can be reduced.

[3] Third Embodiment

In a third embodiment, a word line WL and a bit line EL are selected so that adjacent memory units respectively become in a state of a large power consumption and in a state of a small power consumption. The embodiment is configured so that the power consumption is equalized across a plurality of memory units selected with one address.

[3-1] Configuration of Bank BK

Figure 16:
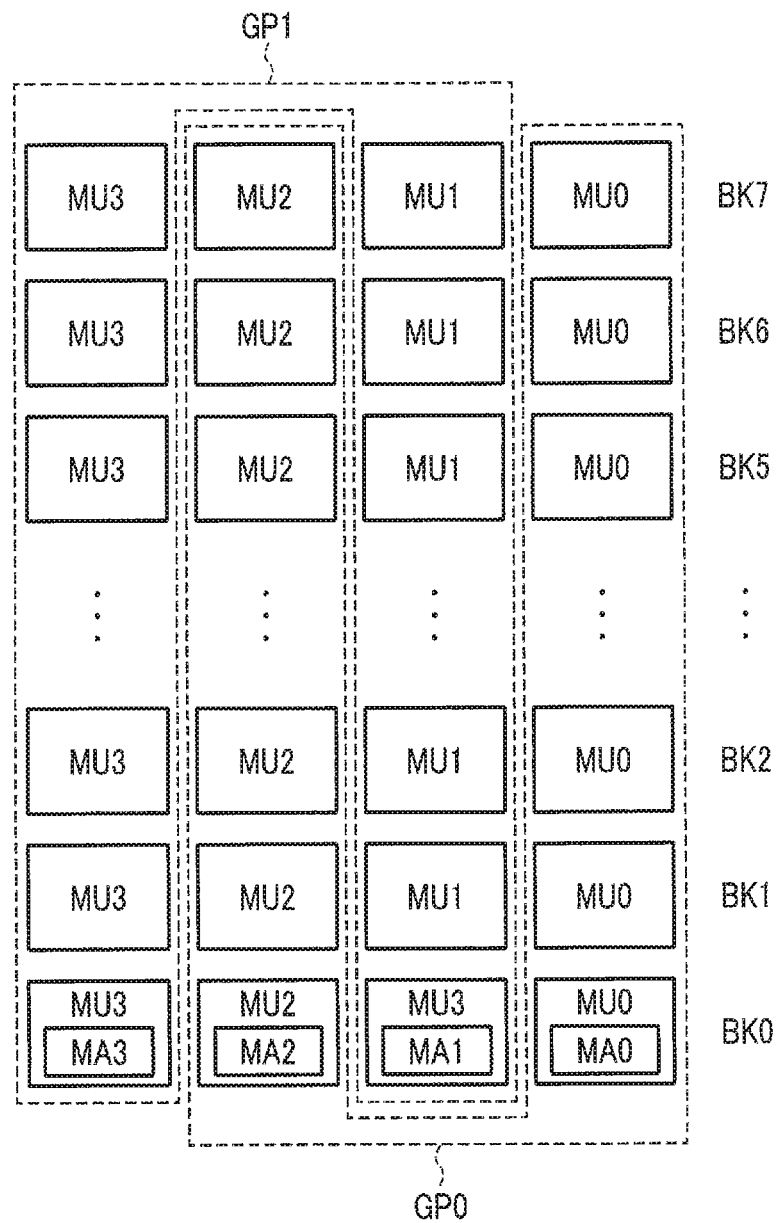
FIG. 16 is a diagram illustrating the configuration of a bank according to a third embodiment.

FIG. 16 is a diagram illustrating the configuration of banks BK according to the third embodiment. FIG. 16 exemplifies eight banks BK0 to BK7 and illustrates an example where one bank BK includes four memory units MU0 to MU3.

Of the memory units MU0 to MU3 included in a bank BK0, the memory units MU0 and MU2 belong to a group GP0, and the memory units MU1 and MU3 belong to a group GP1. The same applies to the banks BK1 to BK7.

The memory units MU0 and MU3 belonging to the group GP0 perform the same selection operation according to the addresses. The memory units MU1 and MU3 belonging to the group GP1 perform the same selection operation according to the addresses. The group GP0 and the group GP1 perform selection operations that are different from each other so that variations in power consumption caused by the addresses are reduced.

[3-2] Operation

The following is explanation on selection operations of memory units MU. FIGS. 17A to 17D are diagrams illustrating a selection operation of memory units according to the third embodiment.

In FIGS. 17A to 17D, the row address RA is zero, and the column address CA is varied from 0 to 3. FIGS. 17A to 17D will be explained in this order.

Figure 17A:
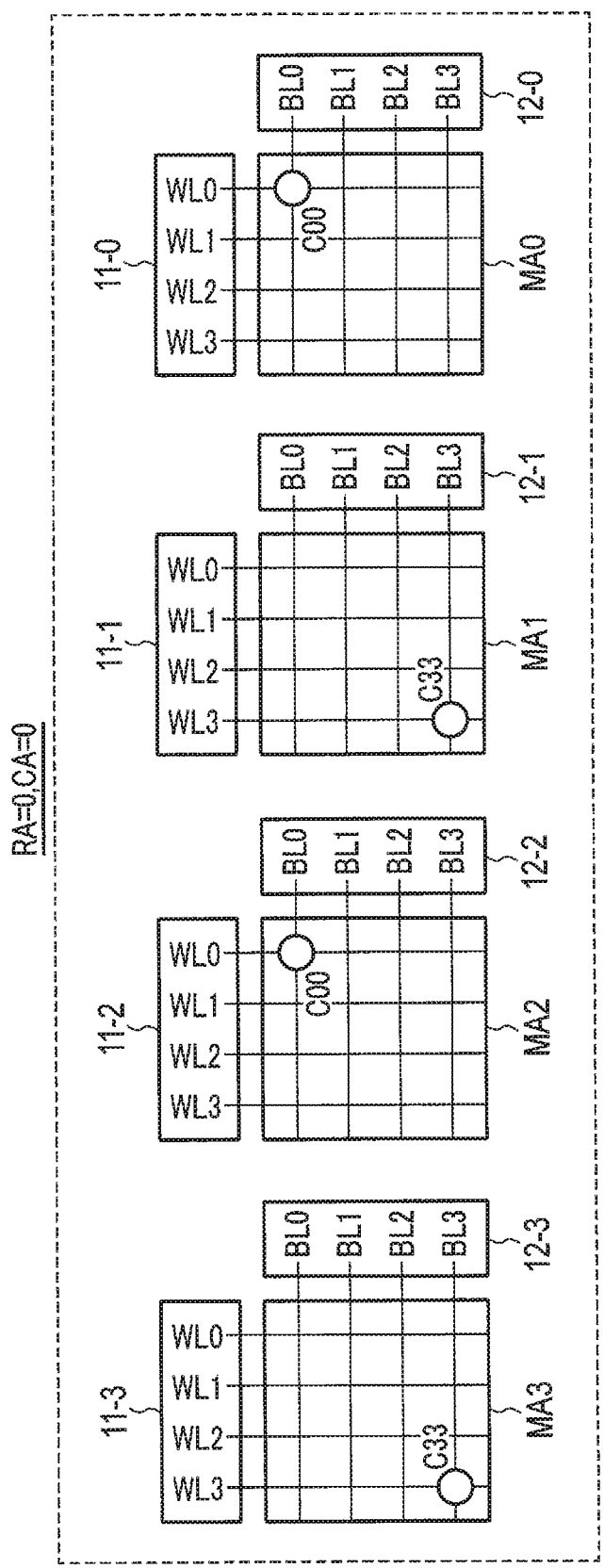
FIG. 17A is a diagram illustrating a select operation of a memory unit according to the third embodiment.

FIG. 17A is a diagram illustrating a selection operation in the case where the row address RA is zero, and the column address CA is zero.

In a memory cell array MA0, the row selection circuit 11-0 selects a word line WL0, and the column selection circuit 12-0 selects a bit line BL0. With this operation, memory cell C00 is selected.

In a memory cell array MA1, the row selection circuit 11-1 selects a word line WL3, and the column selection circuit 12-1 selects a bit line BL3. With this operation, a memory cell C33 is selected.

The selection operation of a memory cell array MA2 is the same as that of the memory cell array MA0. The selection operation of a memory cell array MA3 is the same as that of the memory cell array MA1.

FIG. 17B is a diagram illustrating a selection operation in the case where the row address RA is zero, and the column address CA is 1.

In a memory cell array MA0, the row selection circuit 11-0 selects a word line WL0, and the column selection circuit 12-0 selects a bit line BL1. With this operation, a memory cell C01 is selected.

In a memory cell array MA1, the row selection circuit 11-1 selects a word line WL3, and the column selection circuit 12-1 selects a bit line BL2. With this operation, a memory cell C32 is selected.

The selection operation of a memory cell array MA2 is the same as that of the memory cell array MA0. The selection operation of a memory cell array MA3 is the same as that of the memory cell array MA1.

Figure 17C:
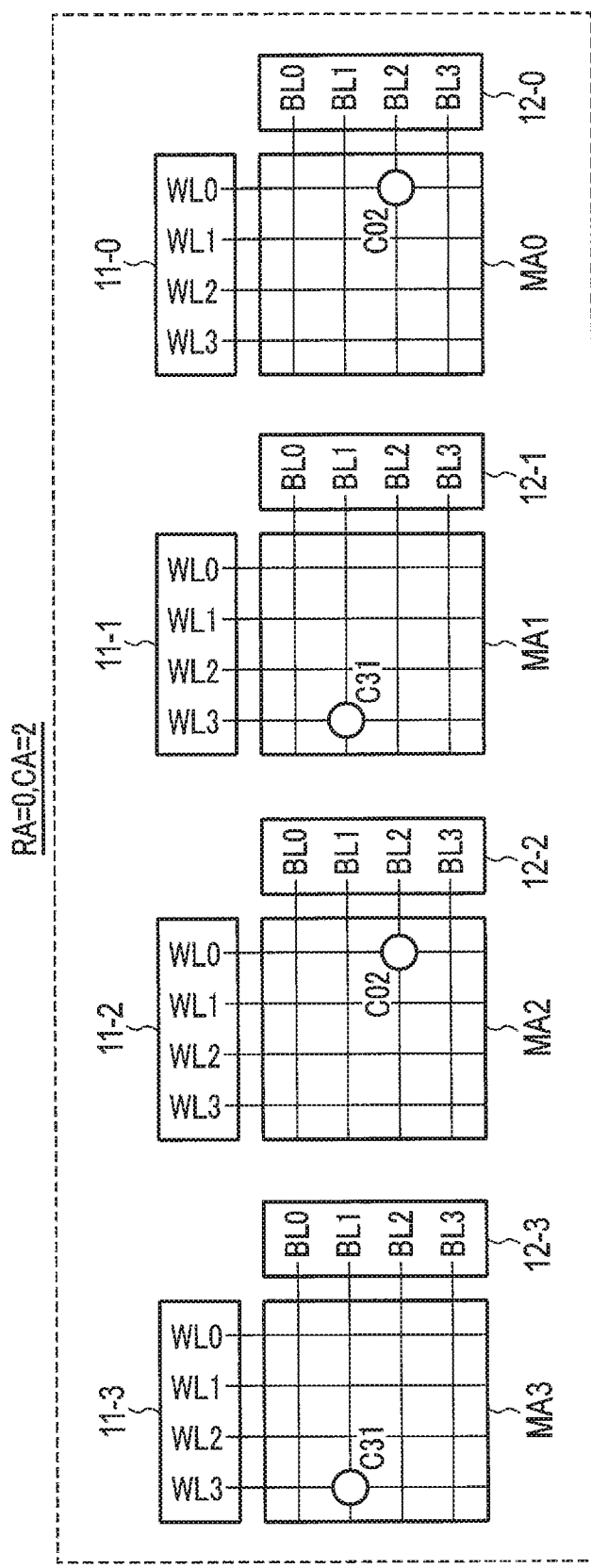
FIG. 17C is a diagram illustrating a select operation of a memory unit according to the third embodiment.

FIG. 17C is a diagram illustrating a selection operation in the case where the row address RA is zero, and the column address CA is 2.

In a memory cell array MA0, the row selection circuit 11-0 selects a word line WL0, and the column selection circuit 12-0 selects a bit line BL2. With this operation, a memory cell C02 is selected.

In a memory cell array MA1, the row selection circuit 11-1 selects a word line WL3, and the column selection circuit 12-1 selects a bit line BL1. With this operation, a memory cell C31 is selected.

The selection operation of a memory cell array MA2 is the same as that of a memory cell array MA0. The selection operation of a memory cell array MA3 is the same as that of the memory cell array MA1.

Figure 17D:
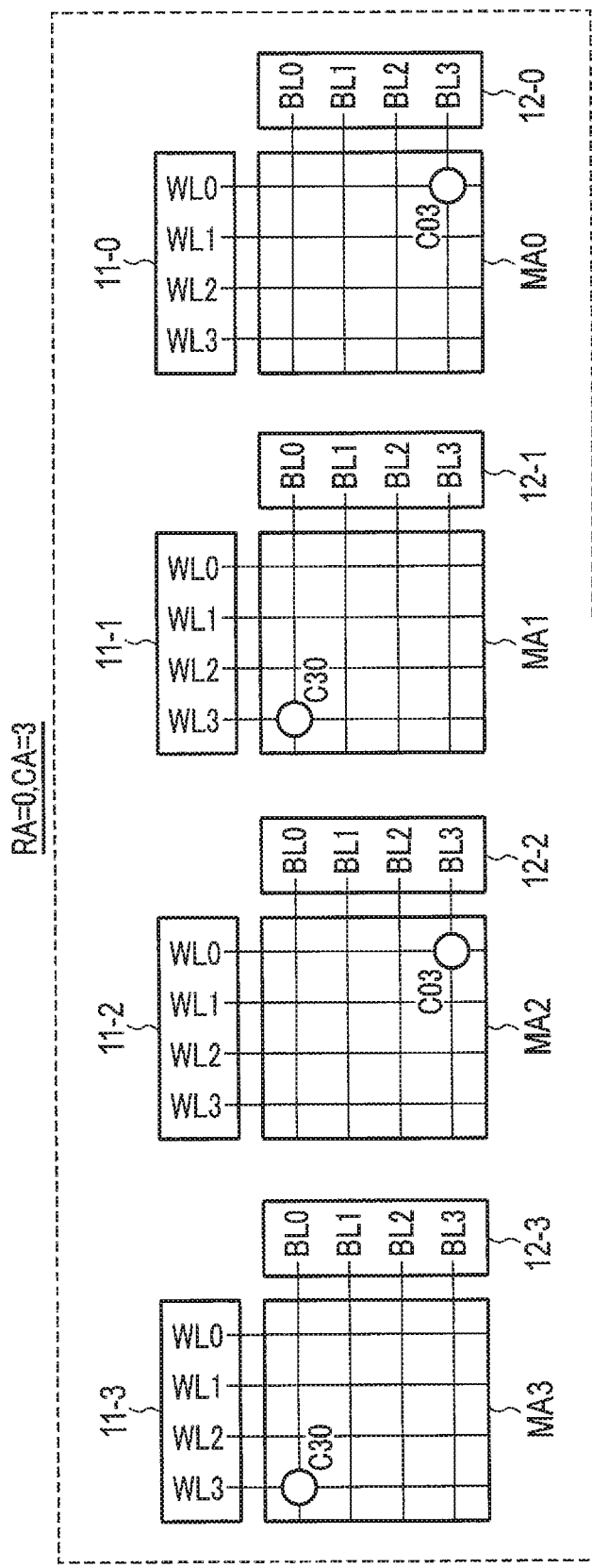
FIG. 17D is a diagram illustrating a select operation of a memory unit according to the third embodiment.

FIG. 17D is a diagram illustrating a selection operation in the case where the row address RA is zero, and the column address CA is 3.

In a memory cell array MA0, the row selection circuit 11-0 selects a word line WL0, and the column selection circuit 12-0 selects a bit line BL3. With this operation, a memory cell C03 is selected.

In a memory cell array MA1, the row selection circuit 11-1 selects a word line WL3, and the column selection circuit 12-1 selects a bit line BL0. With this operation, a memory cell C30 is selected.

The selection operation of a memory cell array MA2 is the same as that of the memory cell array MA0. The selection operation of a memory cell array MA3 is the same as that of the memory cell array MA1.

Similarly, when the row address RA is 1, in the memory cell arrays MA0 and MA2, a selection operation is performed so that the word line WL is shifted by one word line in a positive direction, and in the memory cell arrays MA1 and MA3, a selection operation is performed so that the word line WL is shifted by one word line in a negative direction. The same applies to the case where the row address RA is 2 or 3.

When the column address CA is fixed to a discretional address, and the row address RA is varied, a selection operation is performed so that the relationship between the row address PA and the column address CA in the above-mentioned operations is reversed.

[3-3] Effect of Third Embodiment

Also in the third embodiment, for half of a plurality of simultaneously selected memory units MU with one address (group GP0), a selection operation of a word line and a bit line is performed so that the power consumption increases, and for the remaining half of the memory units (group GP1), a selection operation of a word line and a bit line is performed so that the power consumption decreases. With this configuration, the maximum power consumption in the plurality of memory units MU selected at the same time can be reduced.

[4] Fourth Embodiment

In a fourth embodiment, the row selection circuits 11 and the column selection circuits 12 are arranged in a different manner in a plurality of memory units. In the plurality of memory units MU, the positions of selected memory cells of the arrays are the same.

[4-1] Configuration of Memory Unit MU

FIG. 18 is a block diagram of a plurality of memory units MU according to a fourth embodiment. FIG. 18 exemplifies four memory units MU0 to MU3. For the purpose of simplification, four word lines WL0 to WL3 and four bit lines BL0 to BL3 are provided to each memory cell array MA.

In the memory unit MU0, for example, a row selection circuit 11-0 is disposed on the upper side of a memory cell array MA0, and the column selection circuit 12-0 is disposed on the right side of the memory cell array MA0.

In a memory cell array MA1, the row selection circuit 11-1 is disposed on the lower side of the memory cell array MA1, and the column selection circuit 12-1 is disposed on the left side of the memory cell array MA1. For example, word lines WL0 to WL3 are arranged in this order from left to right, and bit lines DL0 to BL3 are arranged in this order from the bottom to the top of the diagram.

That is the row selection circuit 11-0 and the row selection circuit 11-1 are located opposite to each other in the row direction. The column selection circuit 12-0 and the column selection circuit 12-1 are located opposite to each other in the column direction.

The memory unit MU2 has the same configuration as that of the memory unit MU0. The memory unit MU3 has the same configuration as that of the memory unit MU1. That is, the row selection circuits 11-0 to 11-3 are alternately located in the row direction. The column selection circuits 12-0 to 12-3 are alternately located in the column direction.

[4-2] Operation

The following is explanation of a selection operation of memory units MU. FIGS. 19A to 19D are diagrams illustrating a selection operation of memory units MU according to the fourth embodiment.

In FIGS. 19A to 19D, the row address RA is zero, and the column address CA is varied from 0 to 3. Hereinafter, FIGS. 19A to 19D will be described in this order.

Figure 19A:
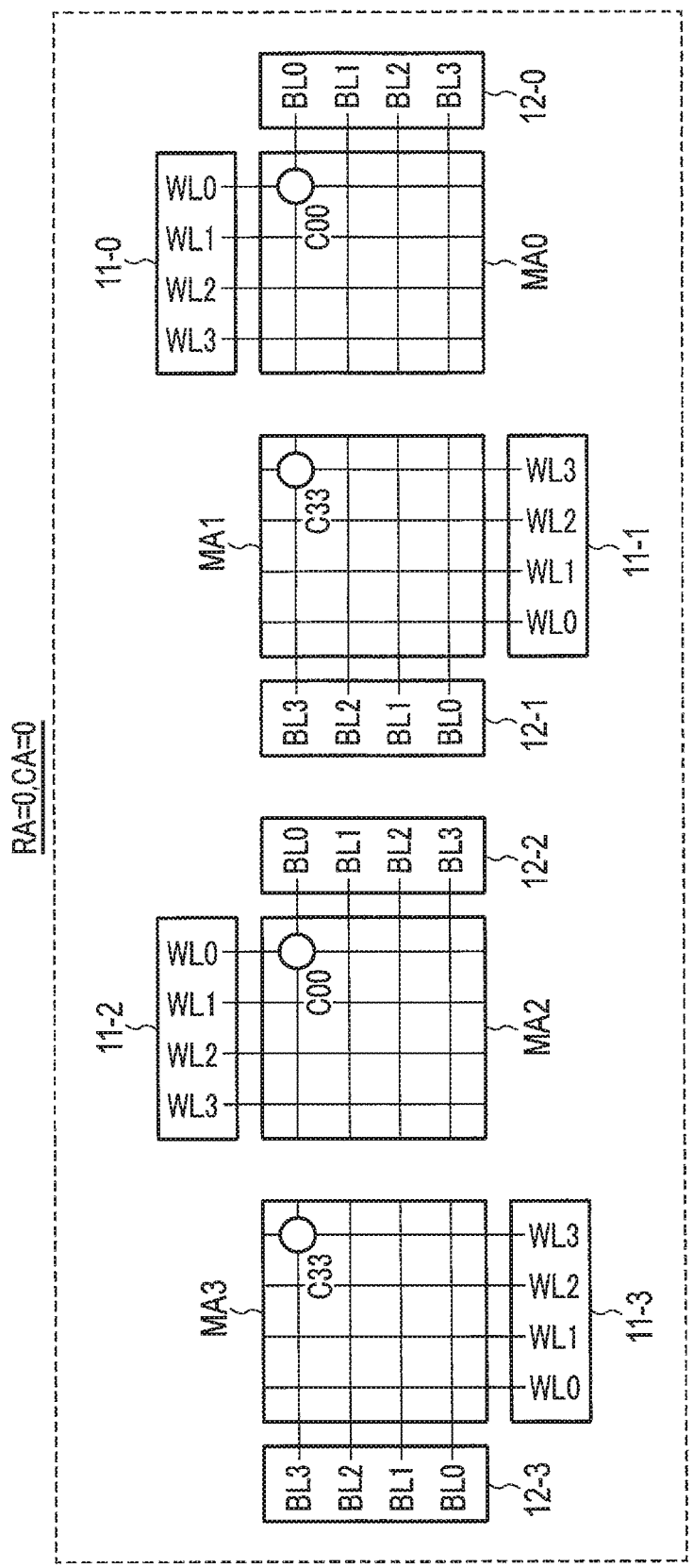
FIG. 19A is a diagram illustrating a select operation of a memory unit according to the fourth embodiment.

FIG. 19A is a diagram illustrating a selection operation in the case where the row address RA is zero, and the column address CA is zero.

In a memory cell array MA0, the row selection circuit 11-0 selects a word line WL0, and the column selection circuit 12-0 selects a bit line BL0. With this operation, a memory cell C00 is selected.

In a memory cell array MA1, the row selection circuit 11-1 selects a word line WL3, and the column selection circuit 12-1 selects a bit line BL3. With this operation, a memory cell C33 is selected.

The selection operation of a memory cell array MA2 is the same as that of the memory cell array MA0. The selection operation of a memory cell array MA3 is the same as that of the memory cell array MA1.

Figure 19B:
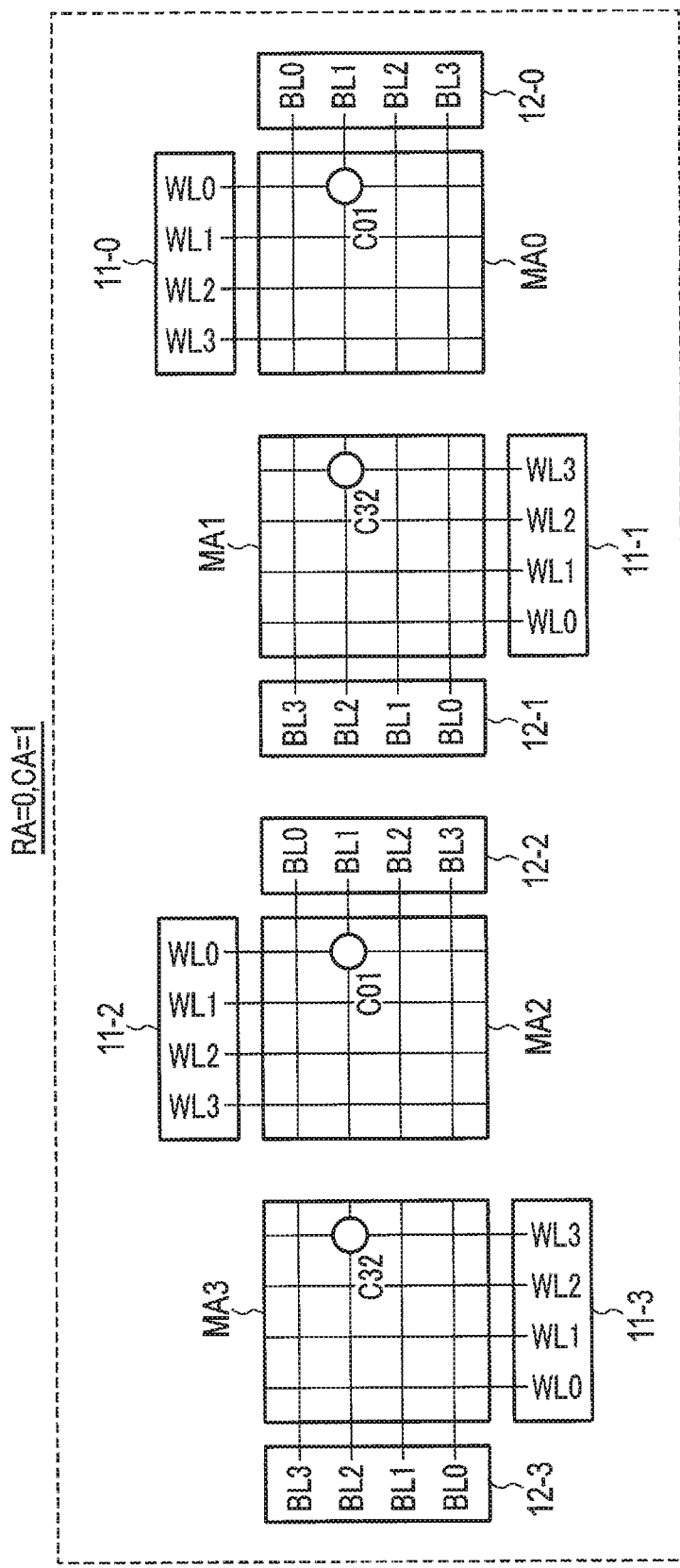
FIG. 19B is a diagram illustrating a select operation of a memory unit according to the fourth embodiment.

FIG. 19B is a diagram illustrating a selection operation in the case where the row address RA is zero, and the column address CA is 1.

In a memory cell array MA0, the row selection circuit 11-0 selects a word line WL0, and the column selection circuit 12-0 selects a bit line BL1. With this operation, a memory cell C01 is selected.

In a memory cell array MA1, the row selection circuit 11-1 selects a word line WL3, and the column selection circuit 12-1 selects a bit line BL2. With this operation, a memory cell C32 is selected.

The selection operation of the memory cell array MA2 is the same as that of the memory cell array MA0. The selection operation of a memory cell array MA3 is the same as that of the memory cell array MA1.

FIG. 19C is a diagram illustrating a selection operation in the case where the row address RA is zero, and the column address CA is 2.

In a memory cell array MA0, the row selection circuit 11-0 selects a word line WL0, and the column selection circuit 12-0 selects a bit line BL2. With this operation, a memory cell C02 is selected.

In a memory cell array MA1, the row selection circuit 11-1 selects a word line WL3, and the column selection circuit 12-1 selects a bit line BL1. With this operation, a memory cell C31 is selected.

The selection operation of a memory cell array MA2 is the same as that of the memory cell array MA0. The selection operation of a memory cell array MA3 is the same as that of the memory cell array MA1.

FIG. 19D is a diagram illustrating a selection operation in the case where the row address RA is zero and the column address CA is 3.

In a memory cell array MA0, the row selection circuit 11-0 selects a word line WL0, and the column selection circuit 12-0 selects a bit line BL3. With this operation, a memory cell C03 is selected.

In a memory cell array MA1, the row selection circuit 11-1 selects a word line WL3, and the column selection circuit 12-1 selects a bit line BL0. With this operation, a memory cell C30 is selected.

The selection operation of a memory cell array MA2 is the same as that of the memory cell array MA0. The selection operation of a memory cell array MA3 is the same as that of the memory cell array MA1.

In the present embodiment, in the memory cell arrays MA0 to MA3, memory cells that are physically present at the same position are selected. Then, a word line WL and a bit line BL are selected so that adjacent memory units become respectively in a state of a large power consumption and in a state of a small power consumption.

Similarly, when the row address RA and the column address CA are varied, memory cells that are physically present at the same position are selected in the memory cell arrays MA0 to MA3.

[4-3] Effect of Fourth Embodiment

In the fourth embodiment, in a bank BK, word lines whose word line lengths are long and whose word line lengths are short from the row selection circuit 11 to a selected memory cell, and bit lines whose bit line lengths are long and whose bit line lengths are short from the column selection circuit 12 to a selected memory cell are evenly selected.

Therefore, according to the fourth embodiment, variations in power consumption can be reduced across the plurality of simultaneously selected memory units MU. With this configuration, the maximum power consumption in the plurality of simultaneously selected memory units MU can be reduced.

[5] Other

Each of the embodiments described above can be modified, for example, as follows.

For the memory cells MC described in the above embodiments, a memory cell in which a selector SEL is provided above a magnetoresistive effect element MTJ has been explained; however, the memory cells are not limited thereto. For example, the memory cell MC may be configured so that a magnetoresistive effect element MTJ is provided above the selector SEL.

Furthermore, for the magnetoresistive effect element MTJ explained in the above embodiments, a top-free type MTJ has been explained in which a storage layer SL is provided above a reference layer RL; however, the magnetoresistive effect element MTJ is not limited thereto. For example, the magnetoresistive effect element MTJ can also be applied to a bottom-free type MTJ in which a storage layer SL is provided closer to the side of a substrate 30 than a reference layer EL (the storage layer SL is provided downward of the reference layer EL).

Furthermore, for the magnetoresistive effect element MTJ explained in the above embodiments, the case where the magnetoresistive effect element MTJ is a perpendicular magnetization type MTJ element has been explained; however, the magnetoresistive effect element MTJ is not limited thereto, and it may be a horizontal magnetization type MTJ element having horizontal magnetization anisotropy.

In the above embodiments, as a semiconductor memory device, an MRAM using a magnetoresistive effect element has been explained as an example; however, the semiconductor memory device is not limited thereto and can be applied to various types of semiconductor memory devices. It can also be applied, for example, to resistance change memories similar to MRAM; for example, a semiconductor memory device having an element that stores data using change in resistance like a resistive random access memory (ReRAM) and a phase-change random access memory (PCRAM). Furthermore, it can be applied to a semiconductor memory device having an element capable of storing data by change in resistance accompanied by application of a current or a voltage irrespective of volatile memories or involatile memories and capable of reading stored data by converting a resistance difference accompanied by a resistance change into a current difference or a voltage difference.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
  a plurality of memory cell arrays each comprising a plurality of memory cells arranged in a matrix form;
  a plurality of word lines respectively connected to a plurality of rows of each of the memory cell arrays;
  a plurality of bit lines respectively connected to a plurality of columns of each of the memory cell arrays;
  a plurality of row selection circuits which respectively correspond to the memory cell arrays and which are respectively connected to the word lines; and
  a plurality of column selection circuits which respectively correspond to the memory cell arrays and which are respectively connected to the bit lines,
  wherein:
  the memory cell arrays include first and second memory cell arrays, the row selection circuits include first and second row selection circuits which correspond to the first and second memory cell arrays, respectively, the column selection circuits include first and second column selection circuits which correspond to the first and second memory cell arrays, respectively, the first row selection circuit and the second row selection circuit are located on different sides, the first column selection circuit is located on a first side of the first memory cell array, the second column selection circuit is located on a second side of the first memory cell array different from the first side, when an identical row address is received, the row selection circuits perform selection operations of word lines so that word line lengths from selected memory cells to the row selection circuits vary, and when an identical column address is received, the column selection circuits perform selection operations of bit lines so that bit line lengths from the selected memory cells to the column selection circuits vary.

2. The semiconductor memory device according to claim 1, wherein:

the row selection circuits and the column selection circuits respectively select a plurality of first memory cells from the memory cell arrays, and the first memory cells differ in position in the memory cell arrays.

3. The semiconductor memory device according to claim 1, wherein:

when the identical row address is received, adjacent row selection circuits in the row selection circuits select adjacent word lines, and when the identical column address is received, adjacent column selection circuits in the column selection circuits select adjacent bit lines.

4. The semiconductor memory device according to claim 1, wherein:

the first row selection circuit and the first column selection circuit select a memory cell with a shorter word line length and a shorter bit line length, and the second row selection circuit and the second column selection circuit select a memory cell with a longer word line length and a longer bit line length.

5. The semiconductor memory device according to claim 1, wherein:

the first row selection circuit and the first column selection circuit select a first memory cell from the first memory cell array, the second row selection circuit and the second column selection circuit select a second memory cell from the second memory cell array, and a position of the first memory cell in the first memory cell array and a position of the second memory cell in the second memory cell array are corresponding.

6. The semiconductor memory device according to claim 1, further comprising:

a decoding circuit that decodes an address received from the outside and generates a row address and a column address.

7. The semiconductor memory device according to claim 1, wherein the memory cells each comprise a memory element and a select element connected to the memory element.

8. The semiconductor memory device according to claim 7, wherein the memory element is a variable resistance element.

9. The semiconductor memory device according to claim 7, wherein the memory element is a magnetoresistive effect element.

10. The semiconductor memory device according to claim 1, wherein:

the first row selection circuit and the first column selection circuit are connected to the first memory cell array, and the second row selection circuit and the second column selection circuit are connected to the second memory cell array.

11. The semiconductor memory device according to claim 1, wherein the first column selection circuit and the second column selection circuit are not in a same line.

12. A semiconductor memory device comprising:

first to fourth memory cell arrays each comprising a plurality of memory cells arranged in a matrix form;

a plurality of word lines respectively connected to a plurality of rows of each of the first to fourth memory cell arrays;

a plurality of bit lines respectively connected to a plurality of columns of each of the first to fourth memory cell arrays;

first to fourth row selection circuits which respectively correspond to the first to fourth memory cell arrays and which are respectively connected to the word lines; and first to fourth column selection circuits which respectively correspond to the first to fourth memory cell arrays and which are respectively connected to the bit lines, wherein:

when an identical row address is received, the first and third row selection circuits perform selection operations of word lines so that word line lengths from selected memory cells to the row selection circuits vary, when an identical column address is received, the first and third column selection circuits perform selection operations of bit lines so that bit line lengths from the selected memory cells to the column selection circuit varies, the second row selection circuit and the second column selection circuit select a memory cell that is at a same position as a position of a memory cell selected by the first row selection circuit and the first column selection circuit, and the fourth row selection circuit and the fourth column selection circuit select a memory cell that is at a same position as a position of a memory cell selected by the third row selection circuit and the third column selection circuit.

13. The semiconductor memory device according to claim 12, wherein:

the first memory cell array and the third memory cell array are arranged so as to be adjacent to each other, and the second memory cell array and the fourth memory cell array are arranged so as to be adjacent to each other.

14. The semiconductor memory device according to claim 12, wherein:

the first to fourth row selection circuits are arranged on a same side relative to the first to fourth memory cell arrays, and the first to fourth column selection circuits are arranged on a same side relative to the first to fourth memory cell arrays.

15. The semiconductor memory device according to claim 12, further comprising:

a decoding circuit that decodes an address received from the outside and generates a row address and a column address.

16. The semiconductor memory device according to claim 12, wherein the memory cells each comprise a memory element and a select element connected to the memory element.

17. The semiconductor memory device according to claim 16, wherein the memory element is a variable resistance element.

18. The semiconductor memory device according to claim 16, wherein the memory element is a magnetoresistive effect element.

19. The semiconductor memory device according to claim 12, wherein when an identical row address and an identical column address are received, the second row selection circuit and the second column selection circuit select a memory cell that is at a same position as a position of a memory cell selected by the first row selection circuit and the first column selection circuit, and the fourth row selection circuit and the fourth column selection circuit select a memory cell that is at a same position as a position of a memory cell selected by the third row selection circuit and the third column selection circuit.

* * * * *